(12) United States Patent
Wylie

(10) Patent No.: US 6,630,699 B1
(45) Date of Patent: Oct. 7, 2003

(54) TRANSISTOR DEVICE HAVING AN ISOLATION STRUCTURE LOCATED UNDER A SOURCE REGION, DRAIN REGION AND CHANNEL REGION AND A METHOD OF MANUFACTURE THEREOF

(75) Inventor: Ian Wylie, Greenwich, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/653,531

(22) Filed: Aug. 31, 2000

(51) Int. Cl.[7] ............................................... H01L 29/72
(52) U.S. Cl. ..................... 257/288; 257/289; 257/291; 257/294
(58) Field of Search ............................... 257/288, 289, 257/291, 294

(56) References Cited

U.S. PATENT DOCUMENTS

| 5,428,243 A | 6/1995 | Wylie |
| 2001/0016383 A1 * | 8/2001 | Chen et al. ................. 257/288 |

* cited by examiner

*Primary Examiner*—Edward Wojciechowicz

(57) ABSTRACT

The present invention provides a transistor device that does not experience the problems associated with the prior art transistor devices. The transistor device includes a dielectric region located in a trench in a semiconductor substrate and a source region and a drain region located in the trench. The source region and drain region are at least partially on the dielectric region. The transistor device further includes a channel region located in the trench between the source region and drain region and at least partially on the dielectric region.

27 Claims, 31 Drawing Sheets

TRANSISTOR DEVICE HAVING AN ISOLATION STRUCTURE LOCATED UNDER A SOURCE REGION, DRAIN REGION AND CHANNEL REGION AND A METHOD OF MANUFACTURE THEREOF

TECHNICAL FIELD OF THE INVENTION

The present invention is directed, in general, to a transistor device and, more specifically, to a transistor device having a dielectric region located under and in contact with a source region, a drain region and a channel region.

BACKGROUND OF THE INVENTION

The advent of the integrated circuit has had a significant impact on various types of communication devices. The integrated circuit has been incorporated into both radio frequency applications and high speed communication network systems. While operation speeds of these communication devices have dramatically increased, the demand for yet faster communication devices continues to rise. Thus, the semiconductor manufacturing industry continually strives to increase the overall speed of the integrated circuit. One way in which the semiconductor industry has increased the speed of the integrated circuit is to continue to shrink the size of the transistor. Over the last few years, the device size of the transistor has gone from 0.5 $\mu$m to 0.32 $\mu$m to 0.25 $\mu$m and now transistor device sizes are heading to the 0.18 $\mu$m range and below. As transistor device sizes have continued to dramatically decrease, with each decrease in size the semiconductor industry has faced new challenges.

One such challenge is that of eliminating parasitic capacitance as much as possible. As transistor geometries shrink, the time delay of signals propagating through the transistor are heavily influenced by the various parasitic capacitances inevitably associated with the structure, when fabricated according to the current state of the art. One of the principal remaining elements of transistor capacitance is the source-drain to substrate capacitance. This junction capacitance as a function of area is increasing as the technology advances. This is in part because one of the principal known failure mechanisms of a short channel transistor is controlled through the use of increased well doping. An increased well doping reduces the diode depletion layer thickness in the well which increases unit capacitance.

Another challenge is reducing "cross-talk." As is well known, cross-talk results when electrical noise, created by transistor devices, travels through the capacitive coupling of the substrate and negatively affects the performance of opposing devices. Though cross-talk has been a well known phenomenon, up until recently it was of less concern. However, as a result of the use of multi-gigahertz operating frequencies in today's RF devices, the significance of cross-talk has increased dramatically. In addition, with the increase in packing density and decrease in device size, transistor devices are being manufactured on the same chip and closer and closer together, which increases the relative importance of the cross-talk problem. Thus, as a result of the increased packing density and the decreased device sizes, both taken in conjunction with the cross-talk problems, device performance and integration issues are becoming increasingly apparent.

Silicon-on-insulator (SOI) already provides a solution to these problems. However, this approach can require the use of a very high current implanter and a very high thermal budget. The use of the very high current implanter and very high thermal budget generally leads to increased manufacturing time, complexity, and most importantly, increased manufacturing cost. Because of the three aforementioned drawbacks of SOI, the semiconductor manufacturing industry is generally unwilling to use the SOI structure on many conventional semiconductor devices.

Accordingly, what is needed in the art is a transistor device and a method of manufacture thereof, that does not experience the parasitic capacitance and "cross-talk" problems associated with the prior art transistors, and does not require the expense, time and effort to fabricate SOI substrates.

SUMMARY OF THE INVENTION

To address the above-discussed deficiencies of the prior art, the present invention provides a transistor device that avoids some of the problems associated with the prior art transistor devices. The transistor device includes a dielectric region located in a trench in a semiconductor substrate and a source region and a drain region located in the trench and at least partially on the dielectric region. The transistor device further includes a channel region located in the trench between the source region and drain region and at least partially on the dielectric region. In summary, the transistor device is isolated in a similar manner as those fabricated on a SOI substrate, however, without the use of SIMOX or wafer bonding.

The transistor device taught herein has reduced parasitic capacitance as compared to the prior art transistors. This is a result of the transistor device being isolated from the substrate and other possible capacitances by the dielectric region. The transistor device also benefits from being isolated from the substrate and other possible capacitances by stress relief oxides and nitride sidewall spacers, also included in the invention. Moreover, the dielectric region not only reduces parasitic capacitance, but it attempts to substantially reduce "cross-talk"caused by transistors and other electrically noisy devices. Therefore, the dielectric region attempts to protect the transistor device from other electrically noisy transistors located on the semiconductor substrate, and vice versa.

In another aspect, the present invention teaches a method of manufacturing the transistor device. The method, in one advantageous embodiment, includes (1) forming a dielectric region in a trench in a semiconductor substrate, (2) forming a source region and a drain region in the trench and at least partially on the dielectric region, and (3) forming a channel region in the trench between the source region and drain region and at least partially on the dielectric region. Further included in the present invention is an integrated circuit, including the transistor device described above. The integrated circuit, may form part of an n-type metal oxide semiconductor (NMOS) device, a p-type metal oxide semiconductor (PMOS) device, a complementary metal oxide semiconductor (CMOS) device, or a BiCMOS device.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1A:
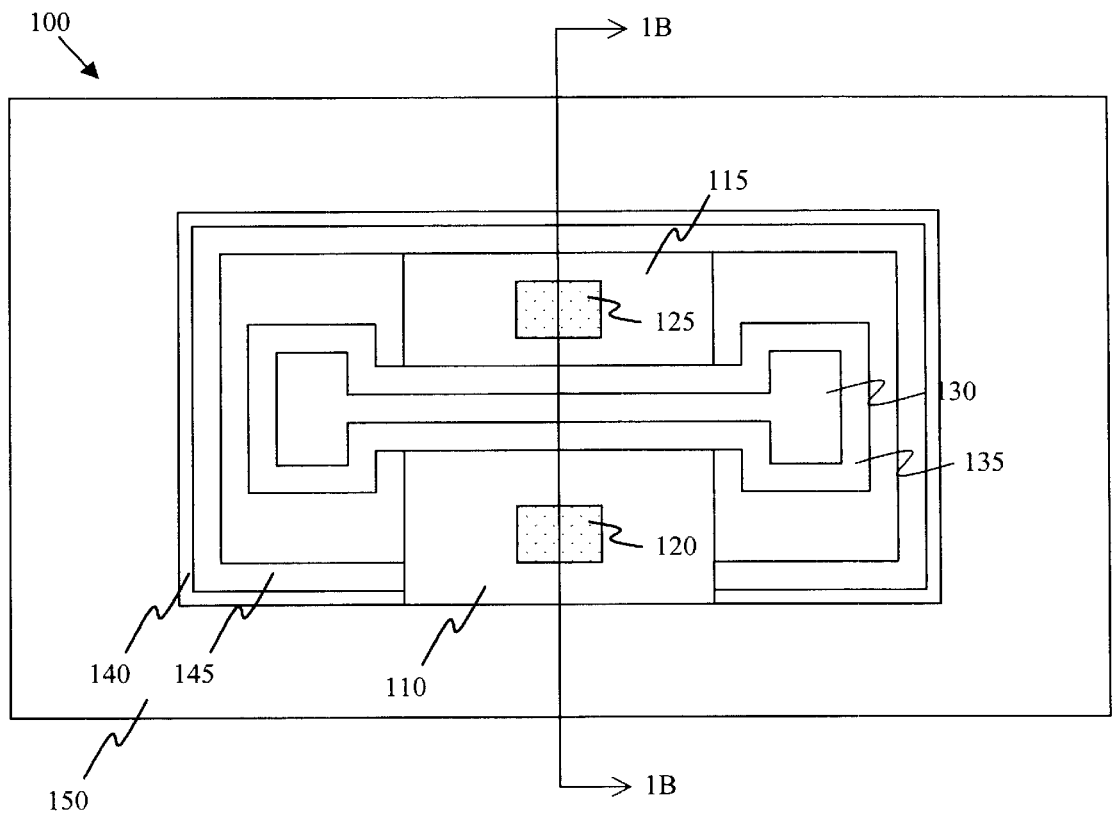
FIGS. 1A, 1B, 1C, 1D illustrate top views, and cross-sectional views, of one advantageous embodiment of a completed transistor device.
Figure 1B:
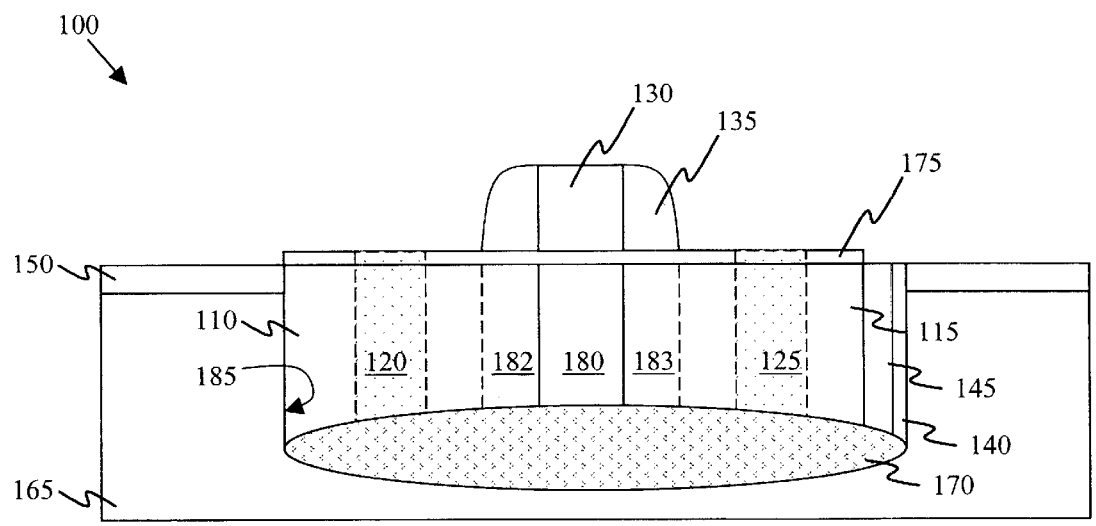
Figure 1C:
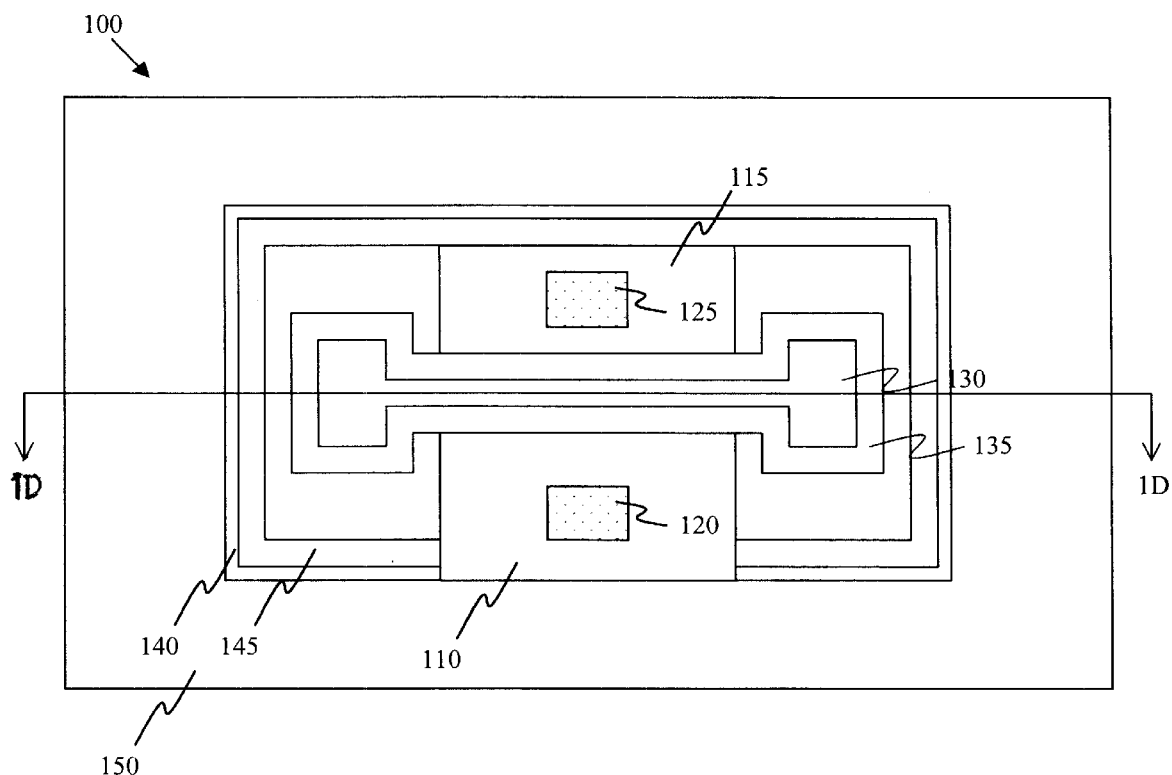

Referring initially to FIGS. 1A, 1B, 1C and 1D, illustrated are top views and cross-sectional views of one advantageous embodiment of a completed transistor device 100, manufactured according to the method described below. The views illustrated in FIGS. 1A and 1C will be described simultaneously, since they are identical. FIGS. 1A and 1C illustrates the completed transistor device 100, including a source region 110 and a drain region 115. As illustrated, the source region 110 and the drain region 115 have a source region contact 120 and a drain region contact 125 located therein. Also illustrated in FIGS. 1A and 1C, are a transistor gate 130 having a gate sidewall spacer 135 connected thereto. Further illustrated in FIGS. 1A and 1C are an oxide layer 140, a nitrided layer 145 and an etch stop layer 150. The oxide layer 140, nitrided layer 145 and etch stop layer 150 are more easily understood with reference to the views illustrated in FIGS. 1B and 1D.

Referring to FIG. 1B, illustrated is a cross-sectional view taken through a line 1B illustrated in FIG. 1A. The cross-sectional view illustrates the source region 110, the drain region 115, the source contact region 120, the drain contact region 125, the transistor gate 130 and the gate sidewall spacer 135. Also illustrated in FIG. 1B, which were also illustrated in FIGS. 1A and 1C, are the oxide layer 140, nitrided layer 145 and the etch stop layer 150. Illustrated in FIG. 1B, but not in FIG. 1A, because of the properties of the view shown, is a semiconductor wafer substrate 165. The semiconductor wafer substrate 165 may be any layer located in a semiconductor device, including a layer located at the wafer level or a layer located above wafer level. Also illustrated in FIG. 1B, but not in FIG. 1A, are a dielectric region 170, a gate oxide 175, a channel region 180, and lightly doped source and drain regions 182, 183. As illustrated, the dielectric region 170 is located in a trench 185 in the semiconductor substrate 165. As further illustrated, the source region 110 and drain region 115 are located in the trench 185 and at least partially on the dielectric region 170. Likewise, as illustrated in FIG. 1B, the channel region 180 is located in the trench 185 between the source region 110 and the drain region 115, and at least partially on the dielectric region 170.

Figure 1D:
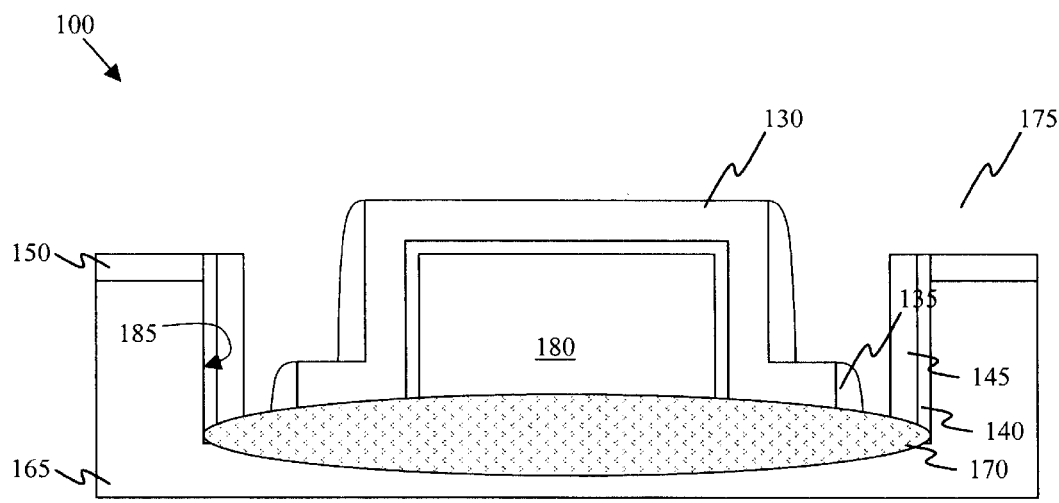

Referring to FIG. 1D, shown is a cross-sectional view taken through a line 1D illustrated in FIG. 1C. The cross-sectional view has many of the same features as the cross-sectional view illustrated in FIG. 1B, but taken through a different cross-section. The cross-section shown in FIG. 1D illustrates, the transistor gate 130, the gate sidewall spacers 135, the oxide layer 140, the nitride layer 145, the etch stop layer 150, the semiconductor wafer-substrate 165, the dielectric region 170, the trench 185 and the channel region 180.

The completed transistor device 100 as illustrated in FIGS. 1A, 1B, 1C and 1D reduces the parasitic capacitance and resistance associated with the prior art transistor devices. This is a result of the completed transistor device 100 being isolated from the substrate 165 and other possible capacitances by the dielectric region 170. The dielectric region 170, in a preferred embodiment, is an oxide region having a dielectric constant three times higher than silicon, but much thicker than the equivalent dielectric in the source/drain region, resulting in a substantially lower capacitive coupling. The oxide layer 140 and nitride sidewall spacer 145 also help to reduce parasitic capacitance. Moreover, the dielectric region 170, the oxide layer 140 and the nitride sidewall spacers 145 not only reduce parasitic capacitance, but they substantially reduce "cross-talk" caused by transistors and other electrically noisy devices. Moreover, the completed transistor device 100 also allows for improvement in the flexibility of the design of the completed device 100 through the use of innovative structures and processing steps. For example, in the case of FIGS. 1A–1D, it is clear that the punch through current of the transistor would be affected or limited by an electric field of the gate wrapping around the channel region on three sides, rather than one side, which is typical for the prior art devices.

Figure 2A:
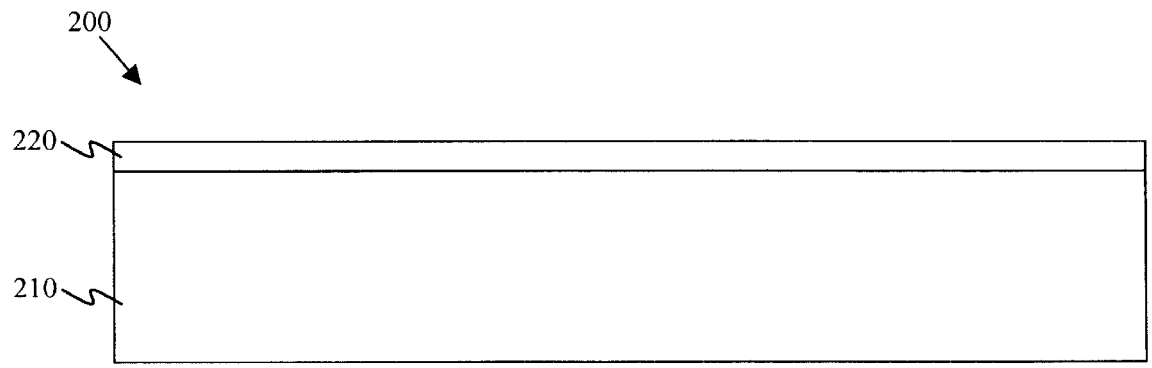
FIG. 2A illustrates a semiconductor wafer substrate after formation of a thin etch stop layer using a conventional chemical vapor deposition (CVD) or other similar process.

Turning now to FIGS. 2A–15D, with continued reference to FIGS. 1A, 1B, 1C and 1D, illustrated are detailed manufacturing steps instructing how one might, in a preferred embodiment, manufacture the completed transistor device 100 depicted in FIGS. 1A, 1B, 1C and 1D. FIG. 2A illustrates a semiconductor wafer substrate 210 after formation of a thin etch stop layer 220, using a conventional chemical vapor deposition (CVD) or other similar process. As illustrated, the etch stop layer 220 is formed over the entire surface of the semiconductor wafer substrate 210. Furthermore, in an exemplary embodiment, the etch stop layer 220 is a silicon nitride etch stop layer having a thickness of about 30 nm. Theoretically, the etch stop layer 220 may have a dual function, not only acting as an etch stop layer, but also preventing oxidation of the semiconductor wafer substrate 210. In one particularly advantageous embodiment, the semiconductor wafer substrate 210 is a single crystal silicon semiconductor wafer substrate.

Figure 2B:
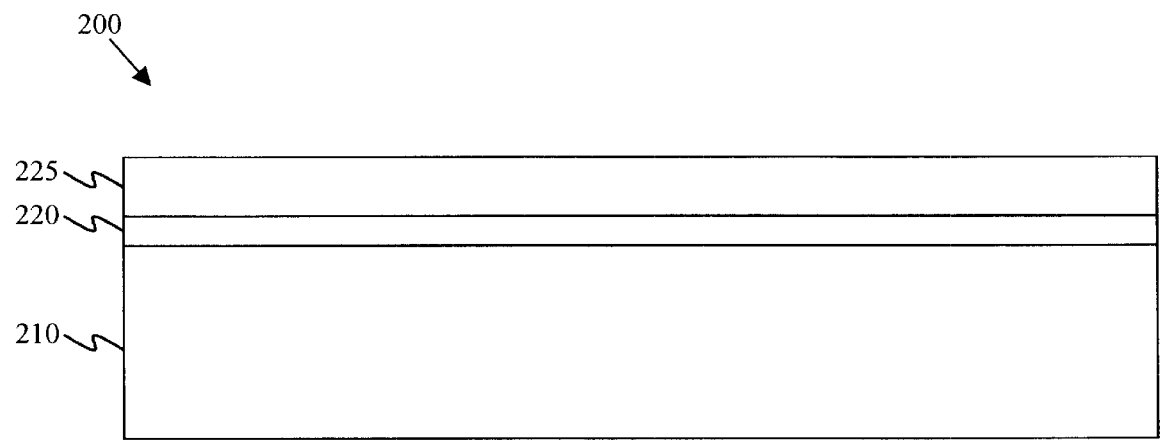
FIG. 2B illustrates the partially completed transistor device illustrated in FIG. 2A after formation of an oxide layer over the etch stop layer.

Now, turning briefly to FIG. 2B, illustrated is the partially completed transistor device 200 illustrated in FIG. 2A, after formation of an oxide layer 225 over the etch stop layer 220. The oxide layer 225 may be deposited using a conventional CVD, spin on glass (SOG) or other similar process, and in an exemplary embodiment is about 100 nm thick. Moreover, the oxide layer 225 is a sacrificial layer that will be removed in a subsequent processing step.

Figure 3A:
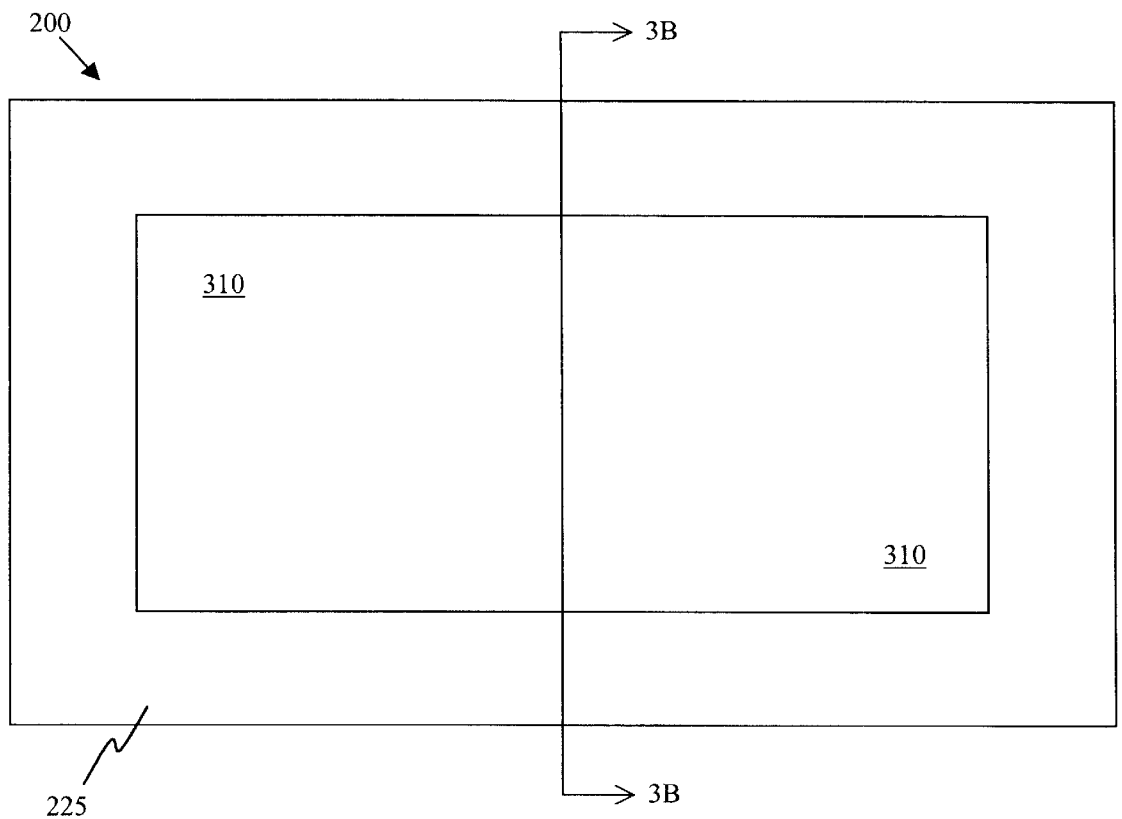
FIGS. 3A and 3B illustrate the formation of a trench within the partially completed transistor illustrated in FIG. 2B.
Figure 3B:
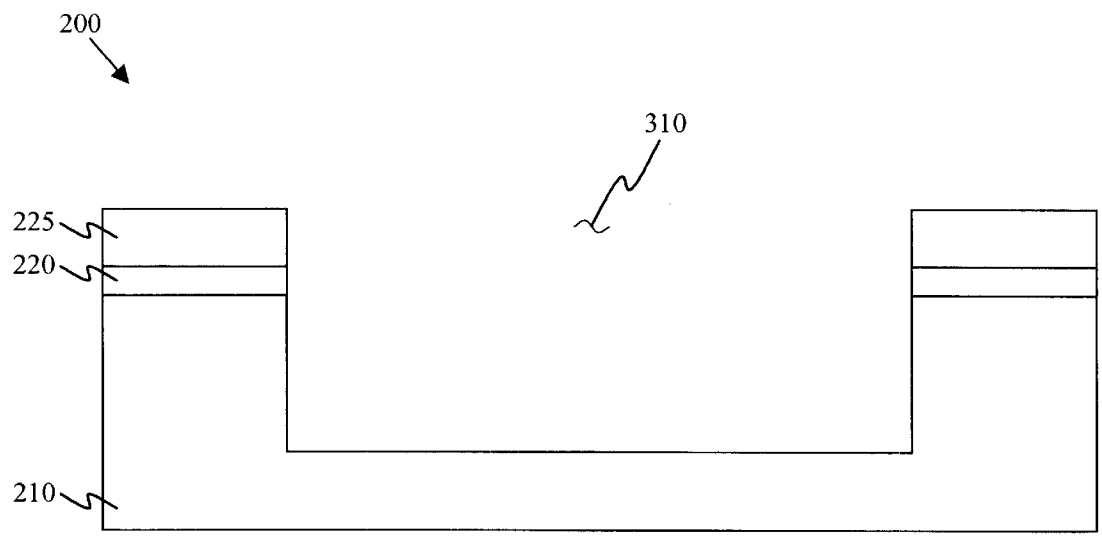

Referring to FIGS. 3A and 3B, which represents a top view 302 and a cross-sectional view 305, respectively, illustrated is the formation of a trench 310 within the partially completed transistor device 200 illustrated in FIG. 2B. It is analogous to the device well in the field oxide for a transistor in the prior art. The trench 310 may be formed in many ways, but in an exemplary embodiment, a first dielectric trench etch is used to remove the desired oxide layer 225 and etch stop layer 220, and a second silicon trench etch is used to produce a trench of the desired depth in the semiconductor wafer substrate 210. In an alternative exemplary embodiment, the first dielectric trench etch is only used to remove the oxide layer 225, and the second silicon trench etch is used to remove the desired etch stop layer 220 and to produce a trench of the desired depth in the semiconductor wafer substrate 210. The depth of the trench should be kept as shallow as possible to reduce the punch through current without impairing the ability of the metallization process to produce metal contacts with minimal contact resistance. The distance that the epitaxial growth must cover should be limited to facilitate that process. Therefore, a dimension of less than about 1000 nm is desirable.

Figure 4A:
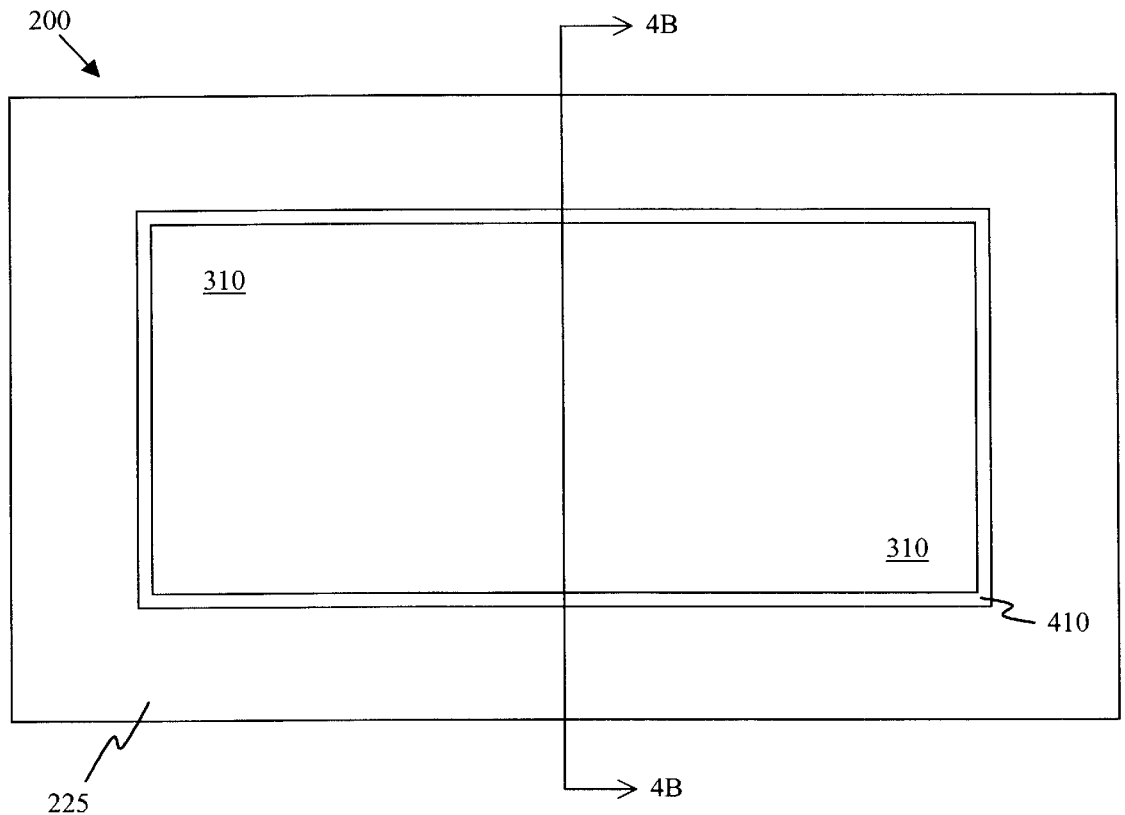
FIGS. 4A and 4B illustrate the formation of a stress relief pad oxide around the trench bottom and trench sidewalls.
Figure 4B:
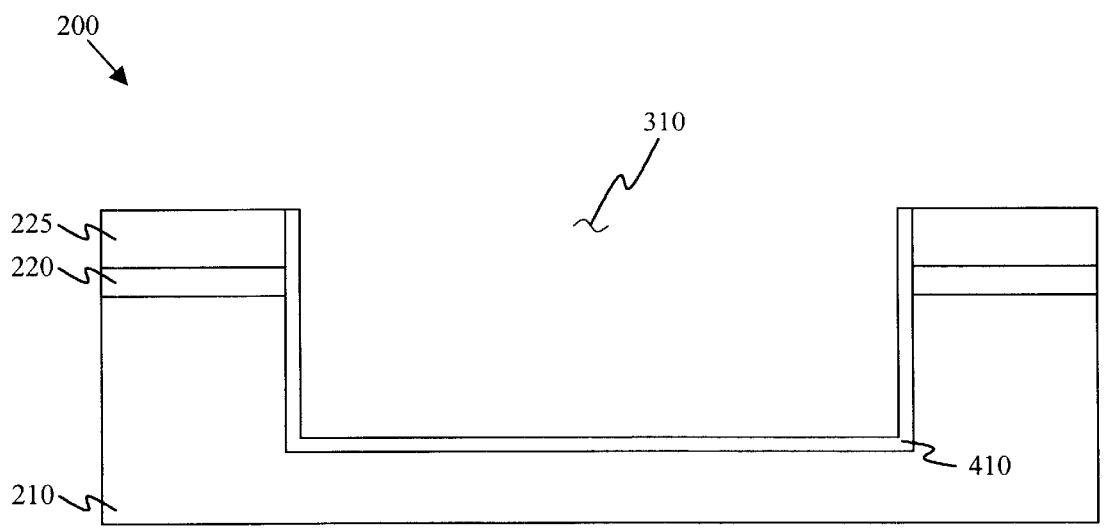

Turning to FIGS. 4A and 4B, illustrated is the formation of a stress relief pad oxide 410 around the trench bottom and trench sidewalls. The stress relief pad oxide 410 may be formed using conventional pad oxide formation processes. For example, the stress relief pad oxide 410 could be formed by a light oxidation process, oxide deposition process or other similar known process. The details of forming the stress relief pad oxide 410 are well known in the art, therefore, the process is not described in greater detail. The thickness of the stress relief pad oxide 410, in comparison to a thin layer of nitride described below, is a critical element. The thickness of the stress relief pad oxide 410 should be predetermined such that it reduces the vertical stress placed upon the semiconductor wafer substrate by a sidewall spacer and the dielectric region 610 (FIG. 6), formed in the following FIGURES. For example; in an advantageous embodiment, the stress relief pad oxide 410 has a thickness of about 15 nm.

Figure 5A:
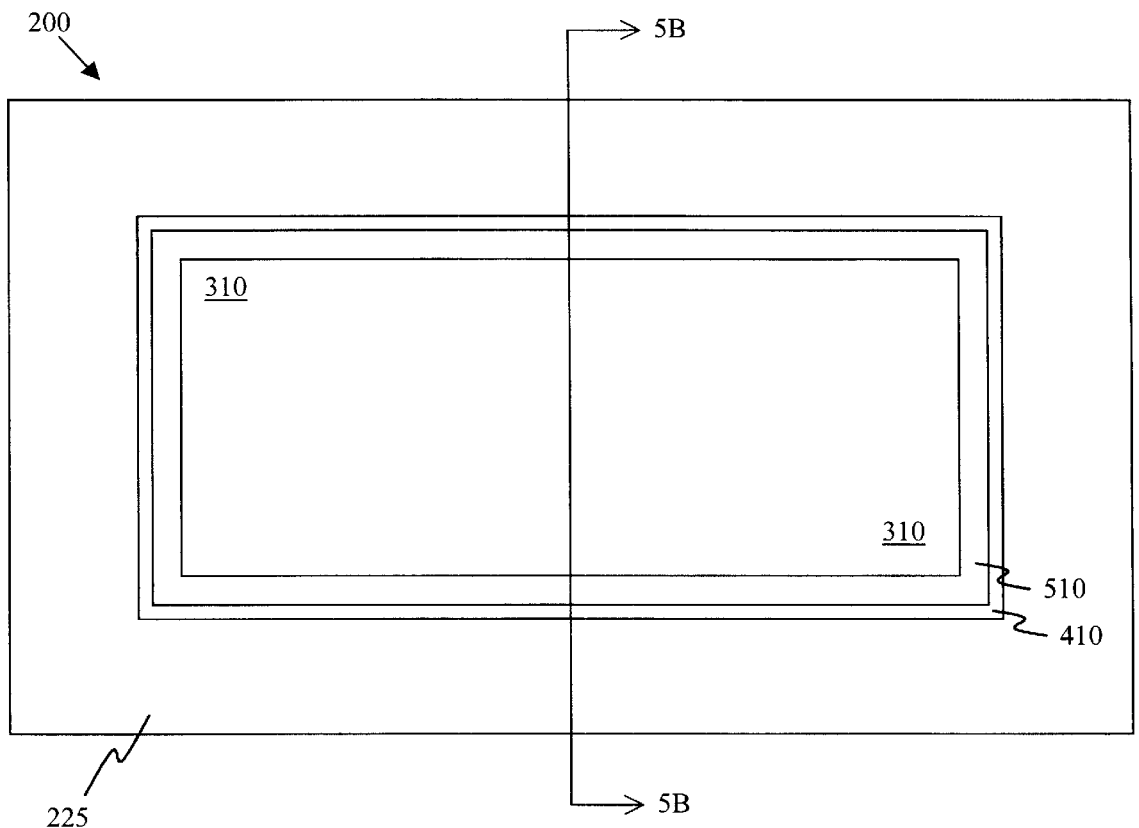
FIGS. 5A and 5B illustrate the partially completed transistor device illustrated in FIGS. 4A and 4B, after formation of sidewall spacers.
Figure 5B:
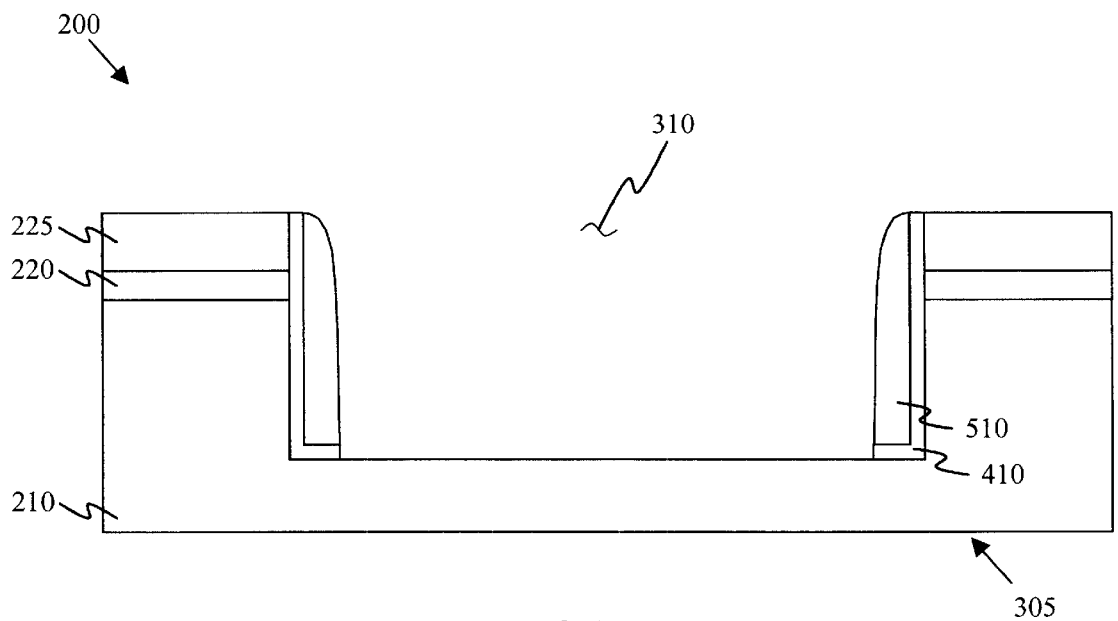

Turning to FIGS. 5A and 5B, illustrated is the partially completed transistor device 200 illustrated in FIGS. 4A and 4B, after formation of sidewall spacers 510. The sidewall spacers 510, in an exemplary embodiment, are formed by depositing a thin layer of nitride over the surface of the partially completed transistor device 200 illustrated in FIGS. 4A and 4B, and performing a traditional anisotropic etch, resulting in the sidewall spacers 510 on the trench 310 walls. In an illustrative embodiment, it is desired for the sidewall spacers 510 to have a thickness of about 80 nm; however, other thicknesses are also within the scope of the present invention.

Figure 6A:
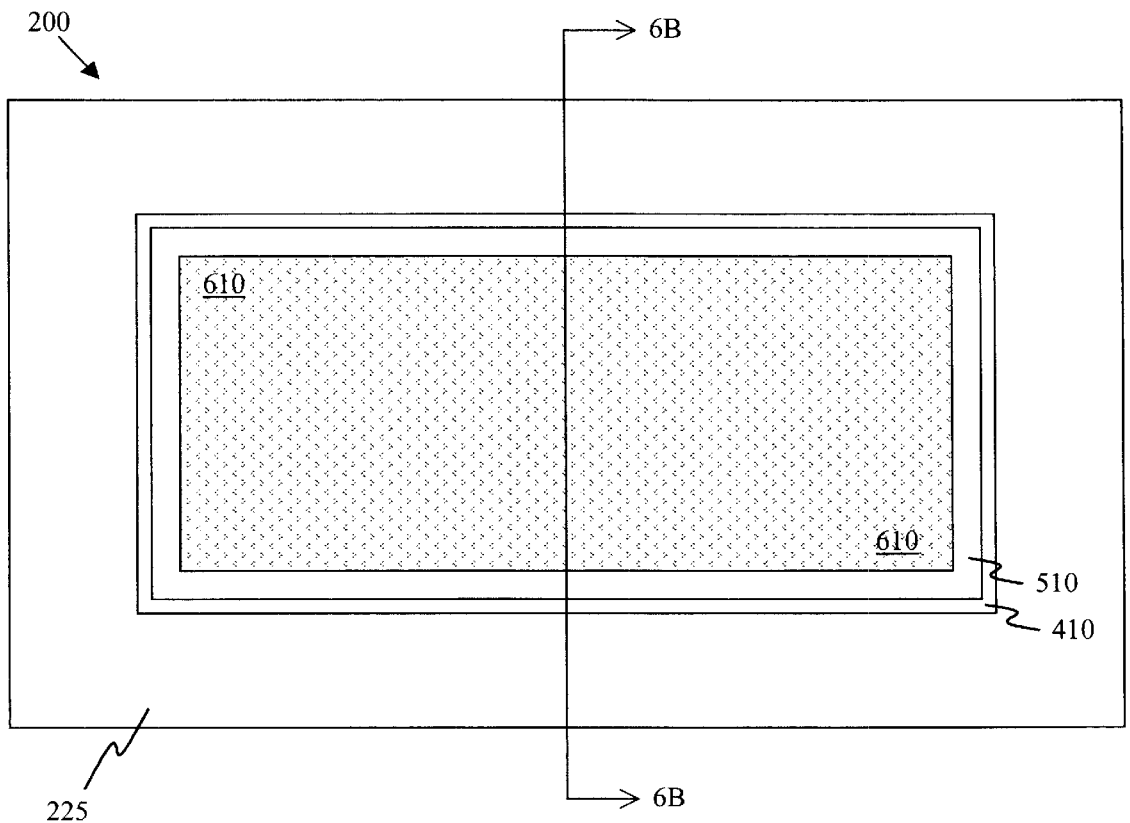
FIGS. 6A and 6B illustrate the partially completed transistor device shown in FIGS. 5A and 5B, after the formation of a dielectric region.
Figure 6B:
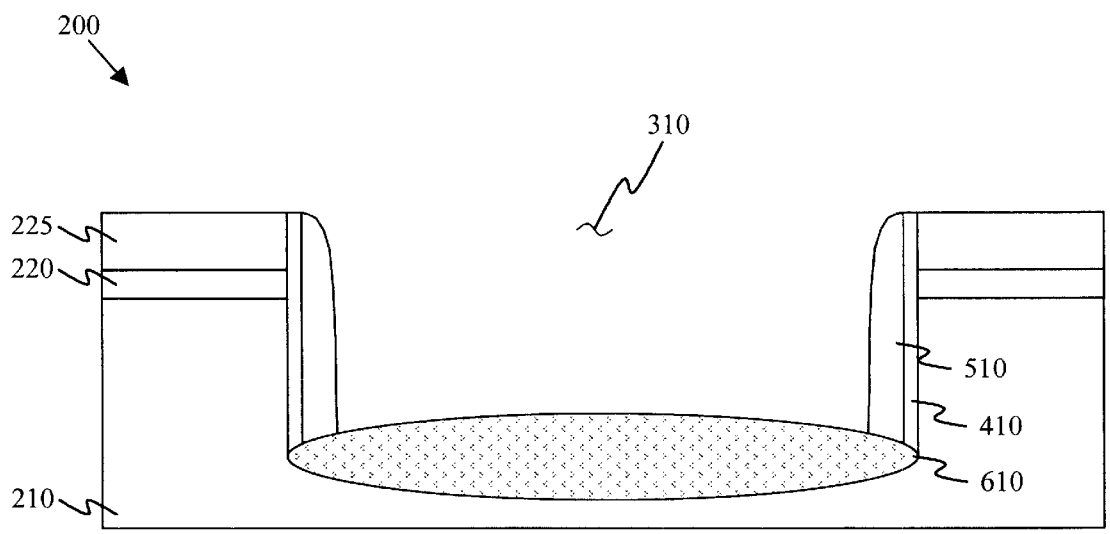

Turning to FIGS. 6A and 6B, illustrated is the partially completed transistor device 200 shown in FIGS. 5A and 5B, after the formation of a dielectric region 610. As illustrated, the dielectric region 610, such as an oxide region, is formed in the bottom of the trench 310 and within the semiconductor wafer substrate 210. In one illustrative embodiment, the dielectric region 610 has a thickness ranging from about 100 nm to about 200 nm, and more specifically a thickness of about 150 nm. The dielectric region 610 may be used, once the device is completed, to isolate the transistor device from the substrate 210 and also to reduce cross-talk between the transistor device and other semiconductor devices on the chip.

Figure 7:
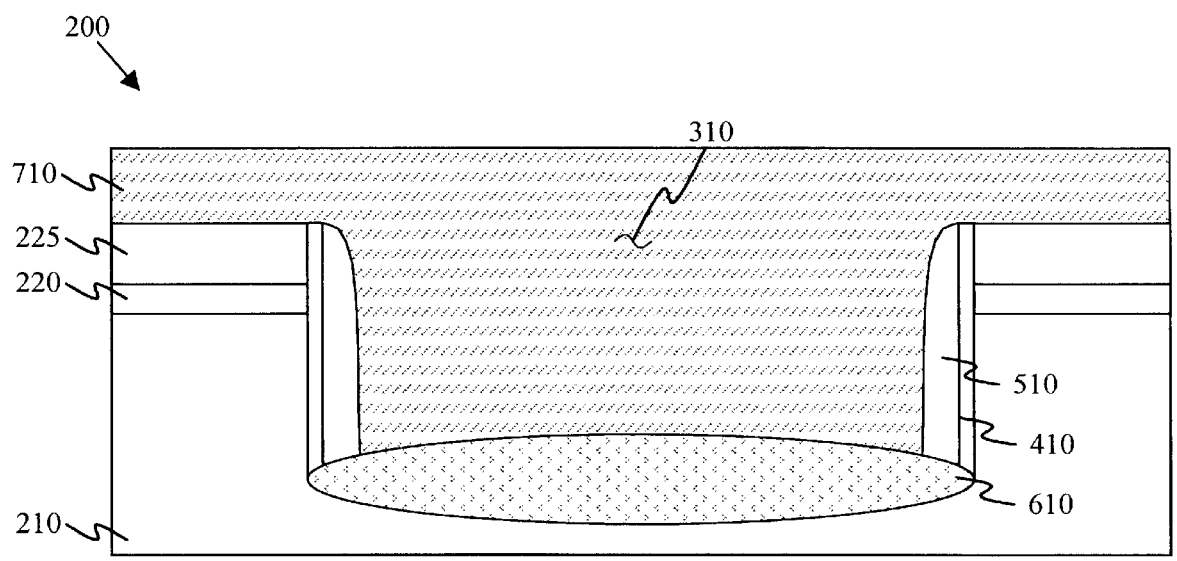
FIG. 7 illustrates the partially completed transistor device illustrated in FIG. 6B after a conformal deposition of a dielectric layer over the oxide layer and within the trench.

Turning to FIG. 7, illustrated is the partially completed transistor device 200 illustrated in FIG. 6B, after a conformal deposition of a dielectric layer 710 over the oxide layer 225 and within the trench 310. The dielectric layer 710, in an exemplary embodiment, is a sacrificial layer of spin on glass (SOG) or another similar material. The dielectric layer 710, as illustrated, may be formed over the entire semiconductor wafer substrate 210.

Figure 8A:
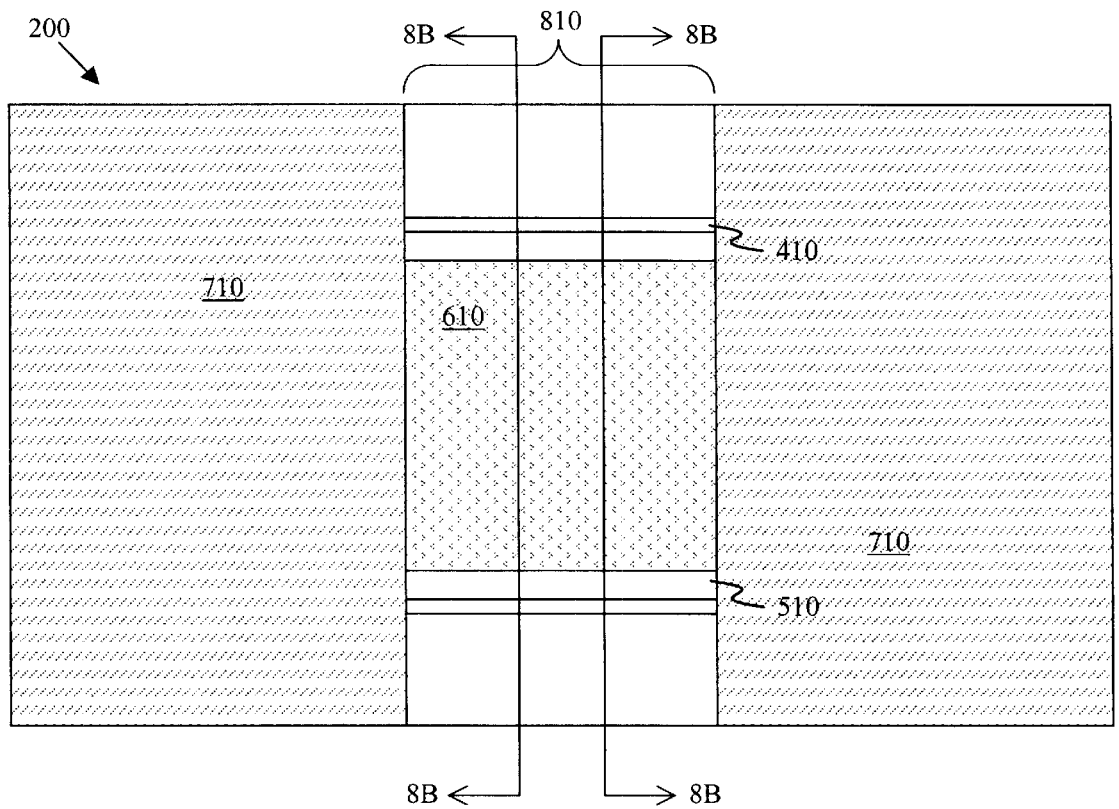
FIGS. 8A and 8B illustrate the partially completed transistor device illustrated in FIG. 7, after masking and etch of an opening or epitaxial channel in the dielectric layer.
Figure 8B:
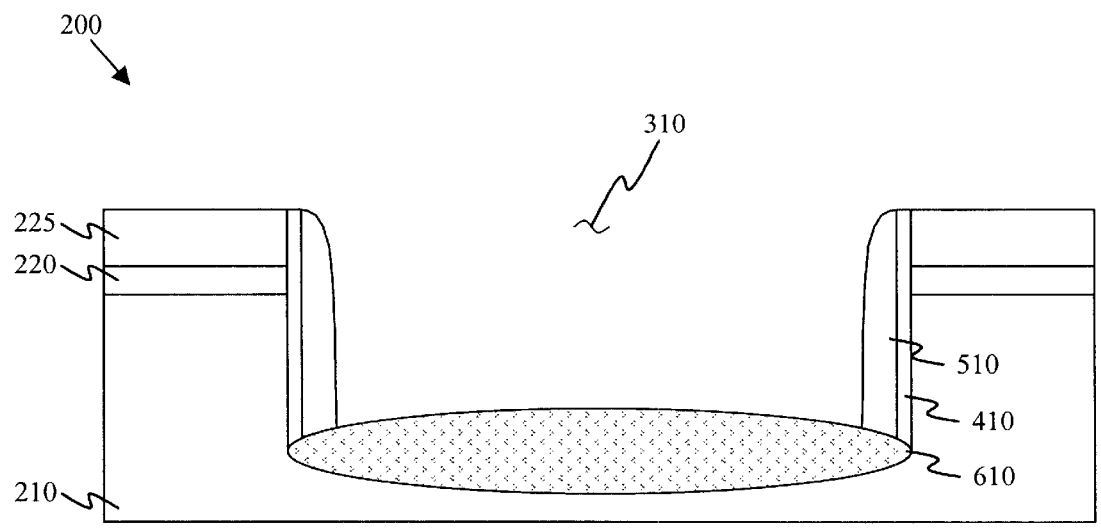

Turning to FIGS. 8A and 8B, illustrated is the partially completed transistor device 200 illustrated in FIG. 7, after formation of an epitaxial channel 810 out of the dielectric layer 710. One having skill in the art understands the conventional steps of depositing, patterning and developing photoresist, followed by a traditional etch, to define the epitaxial channel 810. For example, for a 200 nm process the epitaxial channel 810 should have a length of greater than about 1000 nm. However, one having skill in the art understands that the length of the epitaxial channel 810 may vary and is typically factored depending on the gate length, the sidewall spacer width, the contact dimension and the alignment and etch tolerances.

Figure 9A:
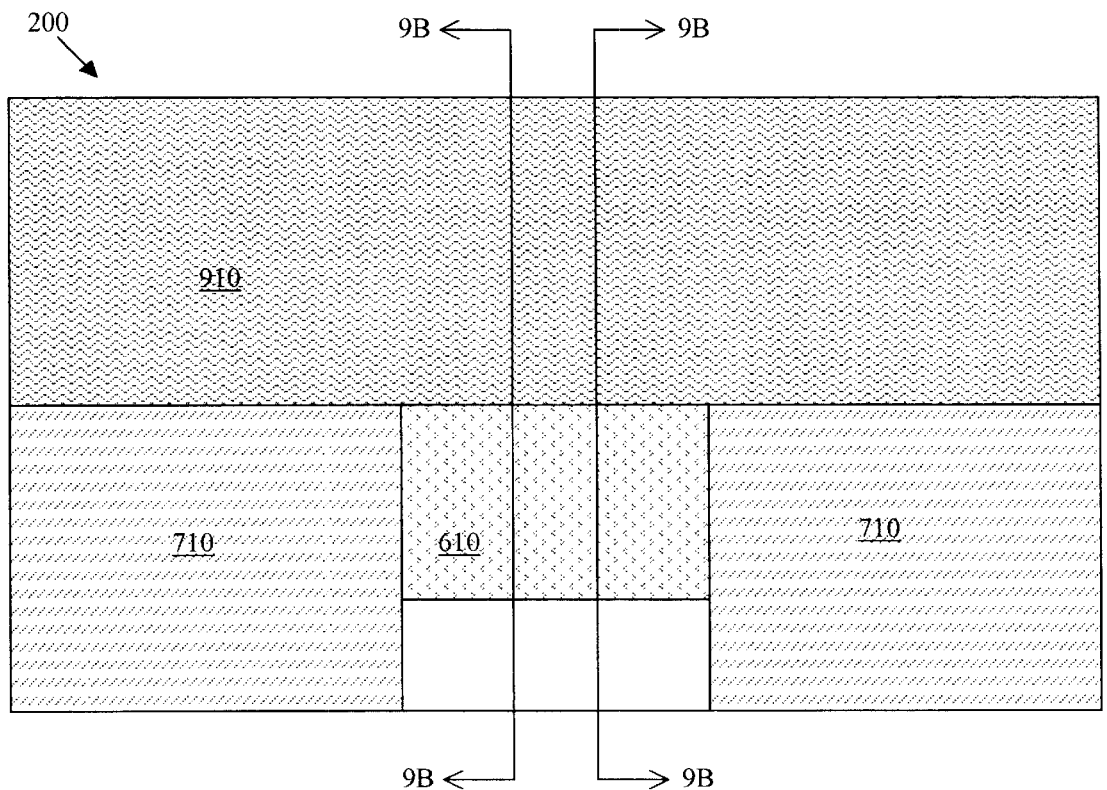
FIGS. 9A and 9B illustrate the partially completed transistor device of FIGS. 8A and 8B, undergoing removal of the nitride sidewall spacer and stress relief oxide from one wall of the trench within the epitaxial channel.
Figure 9B:
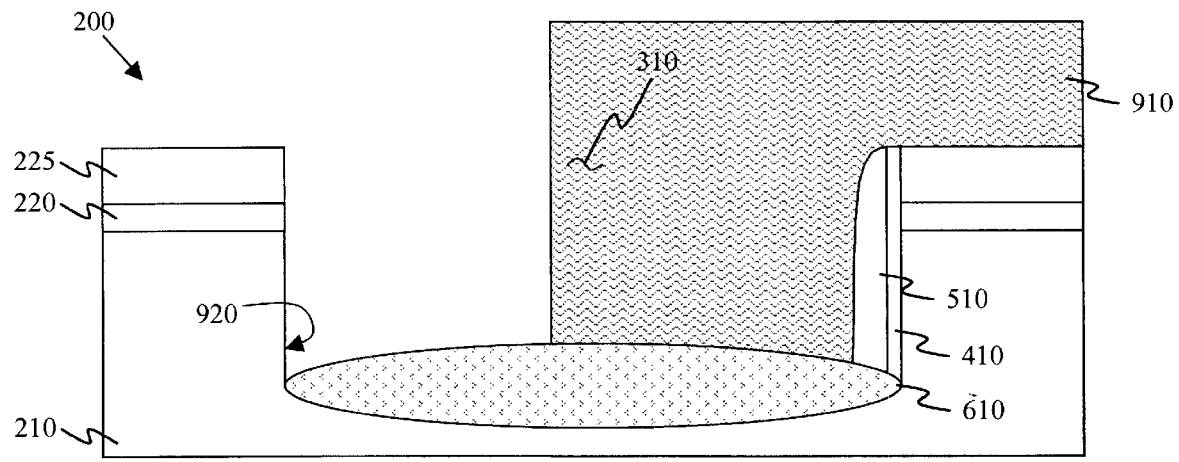

Turning to FIGS. 9A and 9B, illustrated is the partially completed transistor device 200 of FIGS. 8A and 8B, undergoing removal of the nitride sidewall spacer 510 and stress relief oxide 410 from one wall of the trench 310. To remove the nitride sidewall spacer 510 and the stress relief oxide 410 from one wall of the trench 310, a conformal layer of photoresist is deposited, patterned and developed leaving a photoresist portion 910, shown in FIGS. 9A and 9B. A conventional etch and removal of the sidewall spacer 510 and the stress relief oxide 410 from the trench 310 can then be conducted, resulting in the exposed wall of the trench 920 illustrated in FIGS. 9A and 9B.

In an optional step after the removal of a portion of the sidewall spacer 510 and a portion of the stress relief pad oxide 410, the exposed wall of the trench 920 may be subjected to a special sidewall clean to remove remaining residues. For instance, a wet oxidation of about 20 nm followed by an oxide strip, could be used to clean the exposed wall of the trench 920. It should be noted that if the wet oxidation and wet oxidation oxide strip cleaning process were used, the thickness of the dielectric regions 610 should be sufficient to withstand both the stress relief pad oxide wet etch and the wet oxidation oxide strip. After the nitride sidewall spacers 510 and pad oxide 410 have been removed from the wall of trench 310, and the exposed wall of the trench 920 is sufficiently clean, the photoresist portion 910 may be removed using conventional techniques.

Figure 10A:
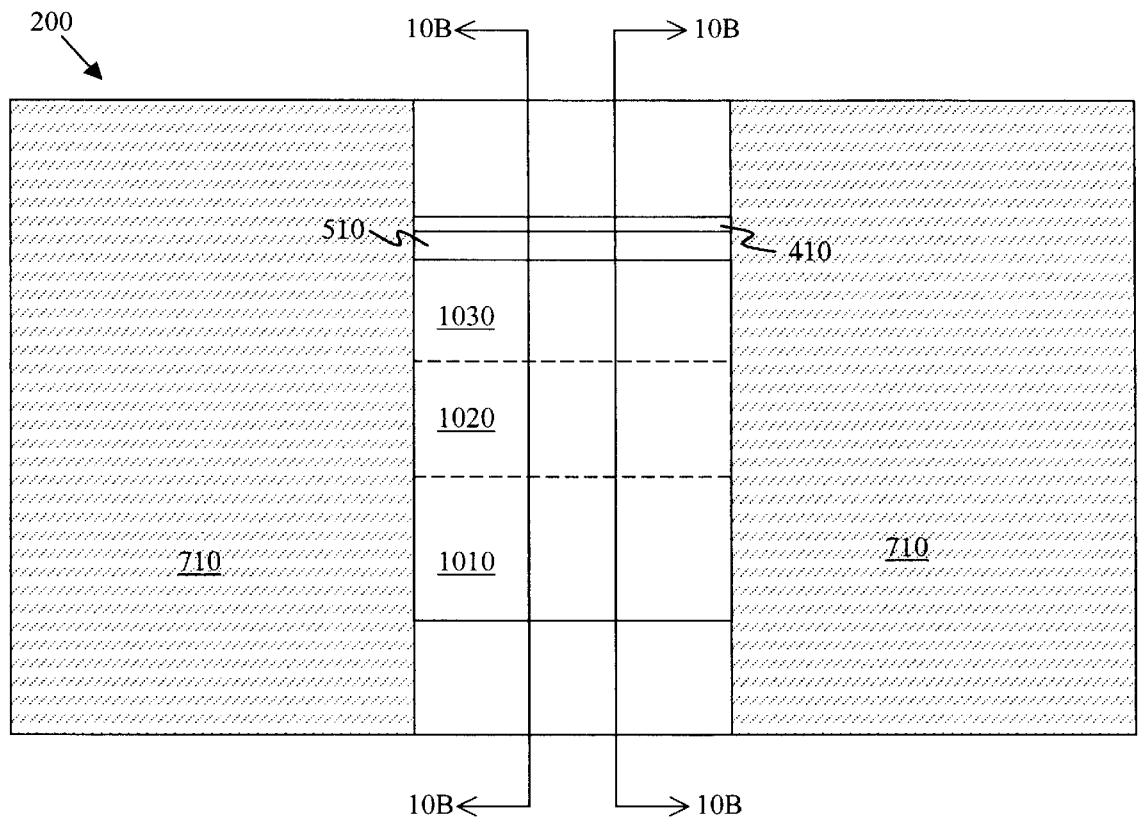
FIGS. 10A and 10B illustrate the formation of a source region, a channel region and a drain region.
Figure 10B:
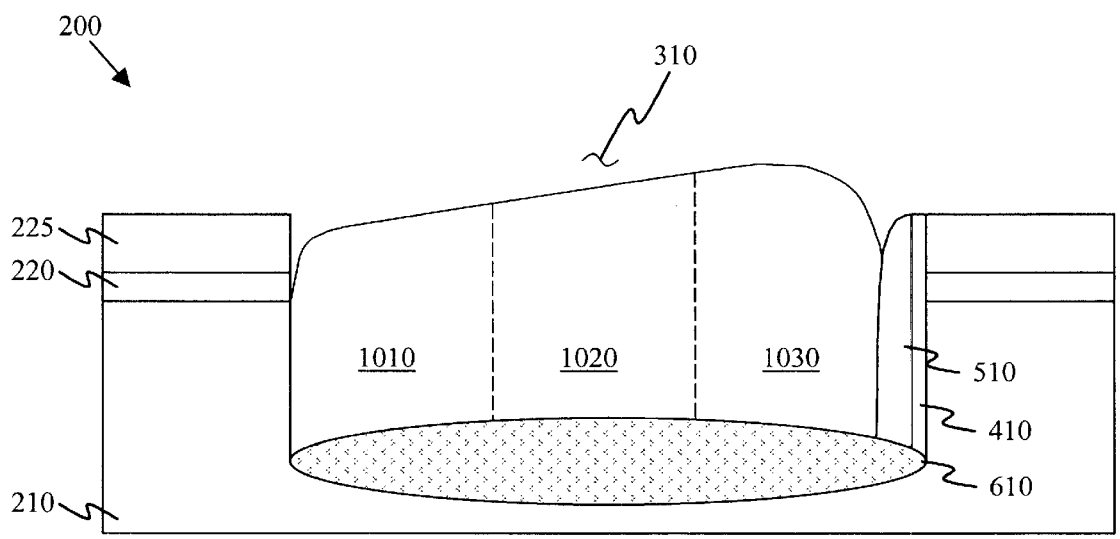

Turning to FIG. 10A and 10B, illustrated is the formation of a source region 1010, a channel region 1020 and a drain region 1030. To form the source region 1010, the partially completed transistor device 200 illustrated in FIGS. 9A and 9B, may be placed within an ultra-clean environment and exposed to an n-type dopant gas, such as silane gas mixed with phosphine. The n-type dopant gas should react with the single crystal silicon present in the exposed wall of the trench 920, and grow an epitaxial or single crystal layer outwards. In an illustrative embodiment, the source region 1010 has a dopant concentration ranging from about 1E19/cm$^3$ to about 1E20/cm$^3$. Typically, the channel region 1020 should be twice the gate width, and the source and drain regions 1010, 1030, should occupy the remaining space. However, the total width of all three regions 1010, 1020, 1030, should be minimized for reasons of efficient packing, and to reduce the later epitaxial growth requirement.

After the source region 1010 is formed, the partially completed transistor device 200 should remain within the ultra-clean environment while the gas is changed from an n-type dopant gas to a p-type dopant gas, such as diborane. The epitaxial silicon growth is further continued, resulting in the channel region 1020 illustrated in FIGS. 10B and 10B. In an exemplary embodiment, the channel region 1020 is lightly doped, having a concentration ranging from about 1E16/cm$^3$ to about 1E17/cm$^3$. Fortunately, the control of concentration profiling possible with epitaxy, is superior to many methods, thus, the final device would have relatively well controlled doping profiles.

Following the formation of the channel region 1020, the partially completed transistor device 200 remains in the ultra-clean environment while the dopant gas is changed back to an n-type dopant gas, resulting in the drain region 1030 illustrated in FIGS. 10A and 10B. The drain region 1030 should have an n-type dopant concentration ranging from about 1E19/cm$^3$ to about 1E20/cm$^3$, i.e., similar to the dopant concentration in the source region 1010.

Figure 10C:
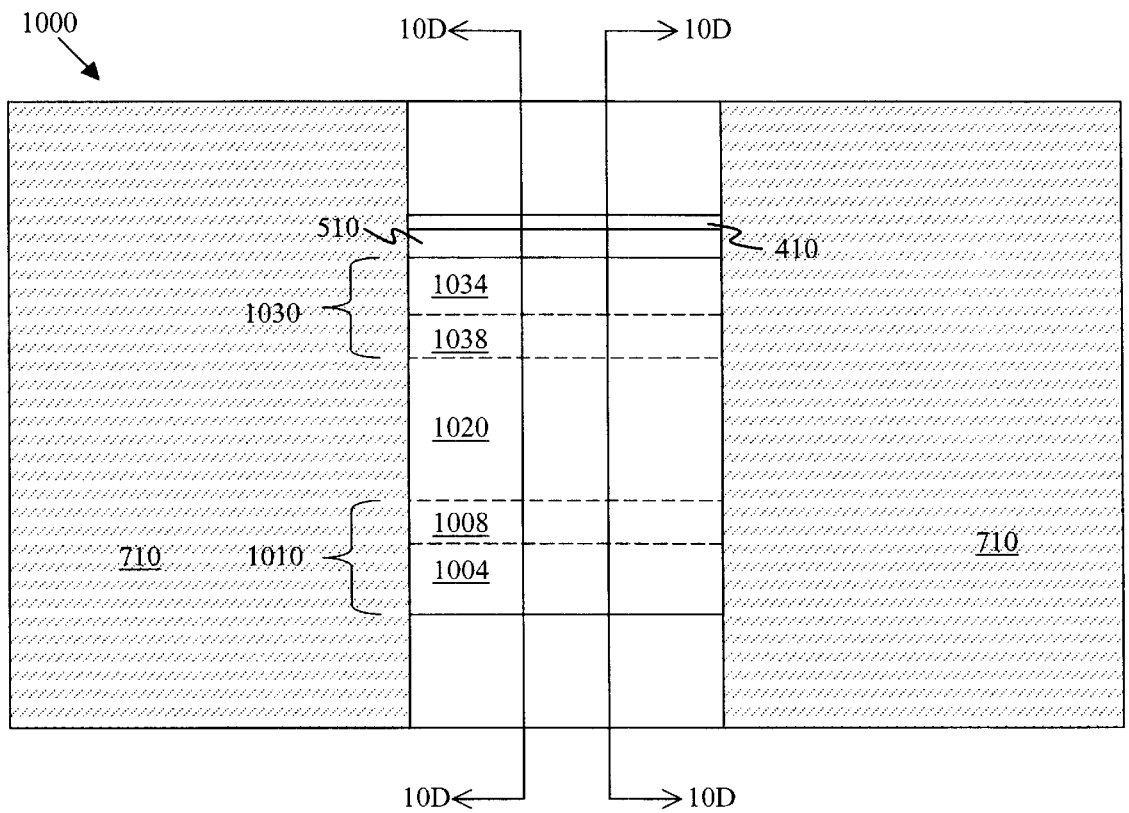
FIGS. 10C and 10D illustrate the formation of an alternative embodiment transistor device, including the formation of a heavily doped source region, a lightly doped source region, a channel region, a heavily doped drain region and a lightly doped drain region.
Figure 10D:
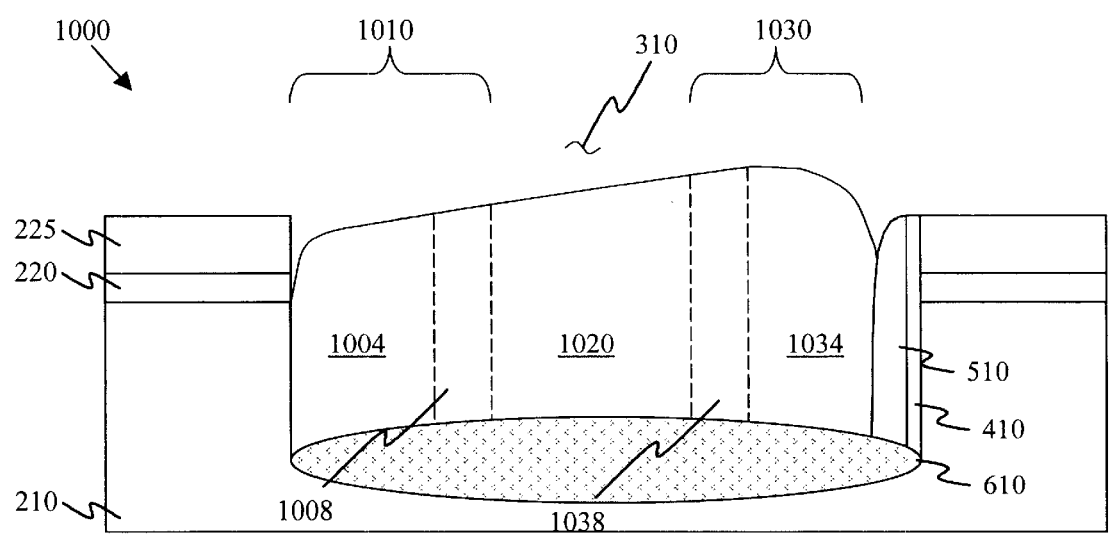

In an exemplary embodiment illustrated in FIGS. 10C and 10D, the source region 1010 has a heavily doped source region 1004 and a lightly doped source region 1008, the channel region 1020 remains lightly doped, and the drain region 1030 has a has a heavily doped drain region 1034 and a lightly doped drain region 1038. Similar to the embodiment described in FIGS. 10A and 10B, the channel region 1020 is located between the source region 1010 and drain region 1030. However, in the embodiment illustrated in FIGS. 10C and 10D, the channel region 1020 is located between the lightly doped source region 1008 and lightly doped drain region 1038. In an exemplary embodiment, the heavily doped source and drain regions 1004, 1034 are doped with an n-type dopant to a concentration ranging from about 1E19/cm$^3$ to about 1E20/cm$^3$ and the lightly doped source and drain regions 1008, 1038, are doped with an n-type dopant to a concentration ranging from about 1E18/cm$^3$ to about 1E19/cm$^3$. In the illustrative embodiment of FIGS. 11A and 11B, the channel region 1020 remains lightly doped with a p-type dopant to a concentration ranging from about 1E16/cm$^3$ to about 1E17/cm$^3$.

One having skill in the art knows that the present invention is not limited to the dopant concentrations mentioned above, and that the dopant concentration profile, taking into account dopant concentration and distance across the Epi channel, could be optimized to reduce punchthrough. Likewise, one having skill in the art understands that the source and drain regions 1010, 1030, could be interchanged by reversing the polarity of the voltages applied to the source and drain regions 1010, 1030, in the completed transistor device 100, illustrated in FIGS. 1A, 1B, 1C and 1D. One having skill in the art also knows that the embodiment described above is an n-type metal oxide semiconductor (NMOS) device, and that the dopants could be reversed in the source region 1010, channel region 1020 and drain region 1030, resulting in a p-type metal oxide semiconductor (PMOS) device.

Figure 11A:
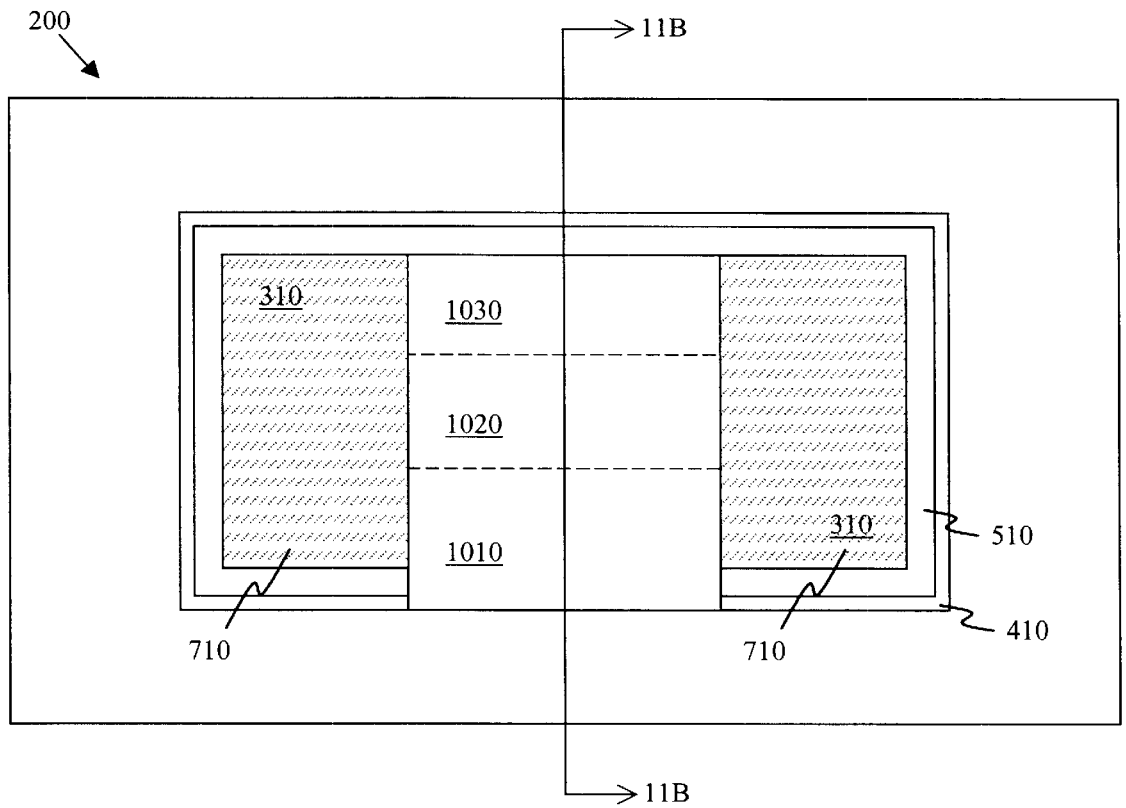
FIGS. 11A and 11B illustrate the partially completed transistor device illustrated in FIGS. 10A and 10B, after a conventional chemical mechanical planarization (CMP) process using the nitride as an etch stop.
Figure 11B:
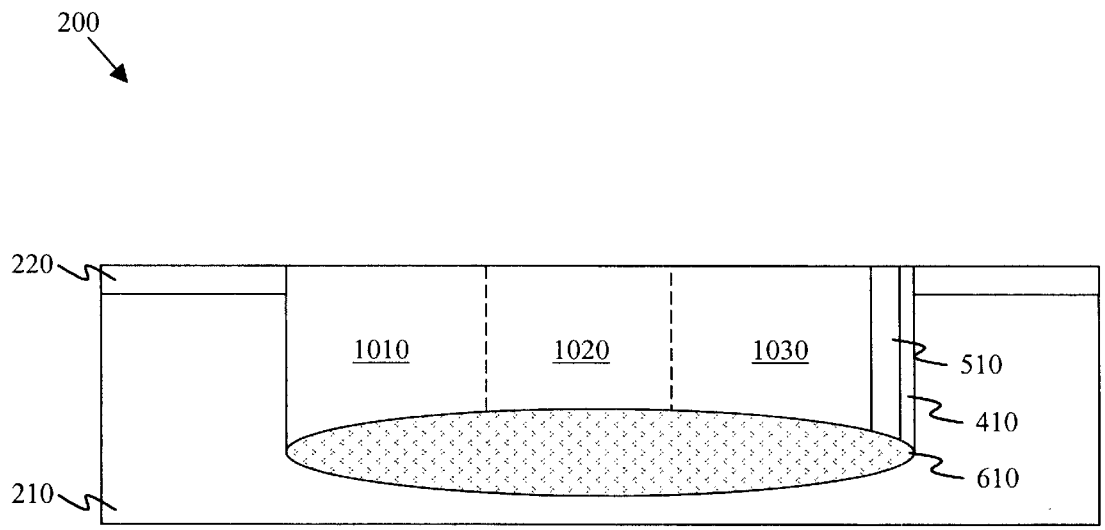

Turning to FIGS. 11A and 11B, illustrated is the partially completed transistor device 200 illustrated in FIGS. 10A and 10B, after a conventional chemical mechanical planarization (CMP) process. In the illustrative embodiment, the CMP process removes the excess dielectric layer 710, the sacrificial oxide layer 225 and vertically over-grown epitaxial regions of the source region 1010, channel region 1020 and drain region 1030. As illustrated in FIG. 11A, the dielectric layer 710 remains in the trench 310, but is removed from areas above the etch stop layer 220.

Figure 12A:
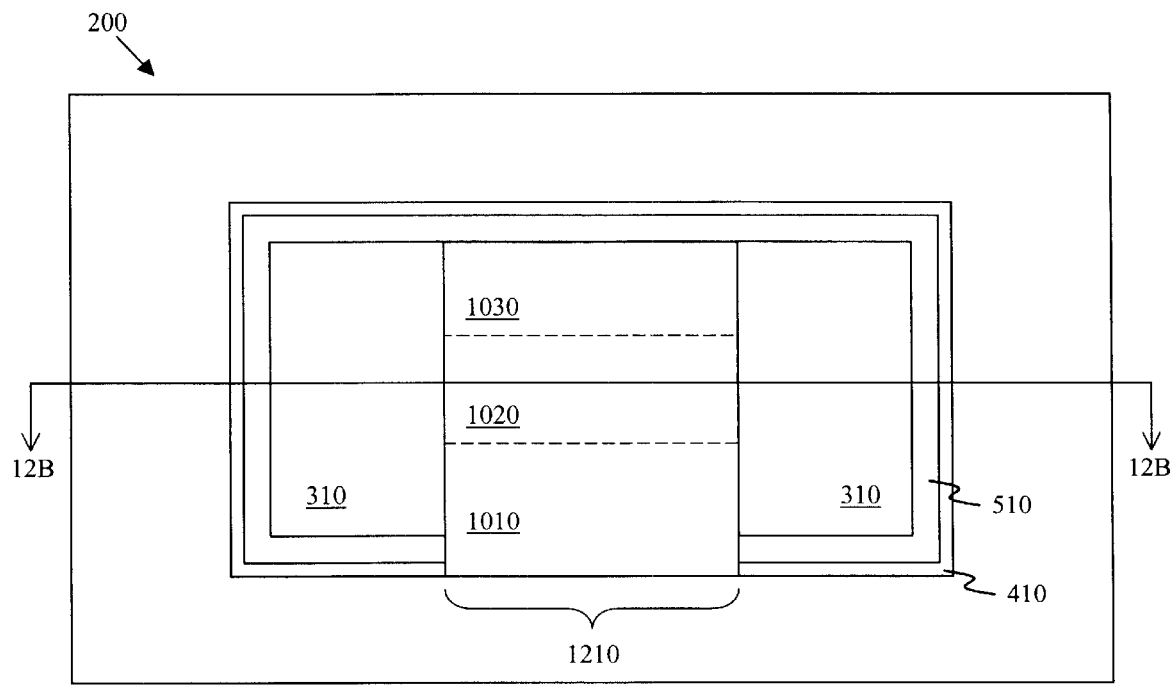
FIGS. 12A and 12B illustrate the partially completed transistor device illustrated in FIGS. 11A and 11B, after a subsequent dielectric layer removal from the trench.
Figure 12B:
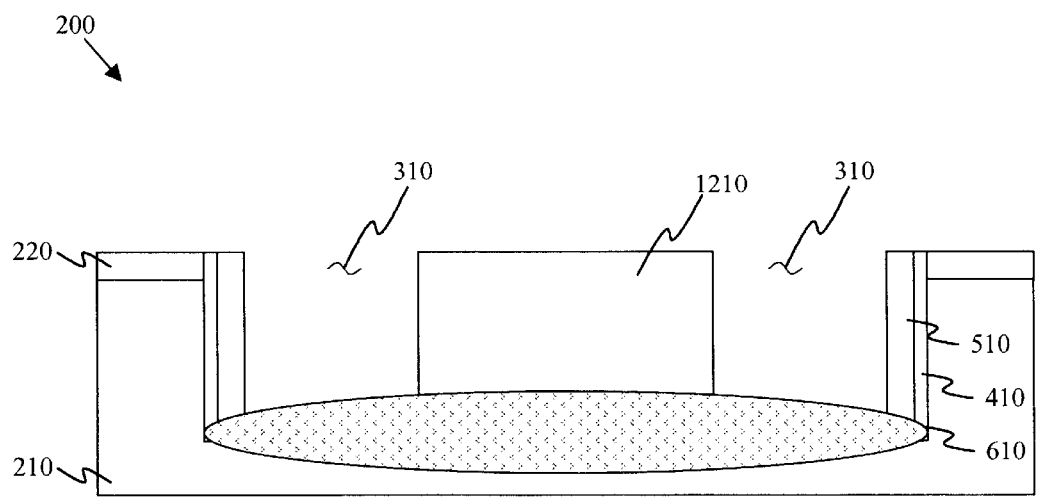

Turning to FIGS. 12A and 12B, illustrated is the partially completed transistor device 200 illustrated in FIGS. 11A and 11B, after a subsequent dielectric layer 710 removal from the trench 310. In an exemplary embodiment, the dielectric layer 710 is removed from the trench 310 using a buffered hydrofluoric etch. However, one having skill in the art knows that other similar removal techniques could be used to remove the dielectric layer 710 from the trench 310. What results after the removal of the dielectric layer 710 from the trench 310 is a post 1210 comprising the source region 1010, channel region 1020 and drain region 1030. Subsequent to the removal of the dielectric layer 710, in an exemplary embodiment not illustrated, the post 1210 may be subjected to a wet pre-gate oxidation and a wet pre-gate oxidation etch.

Figure 13A:
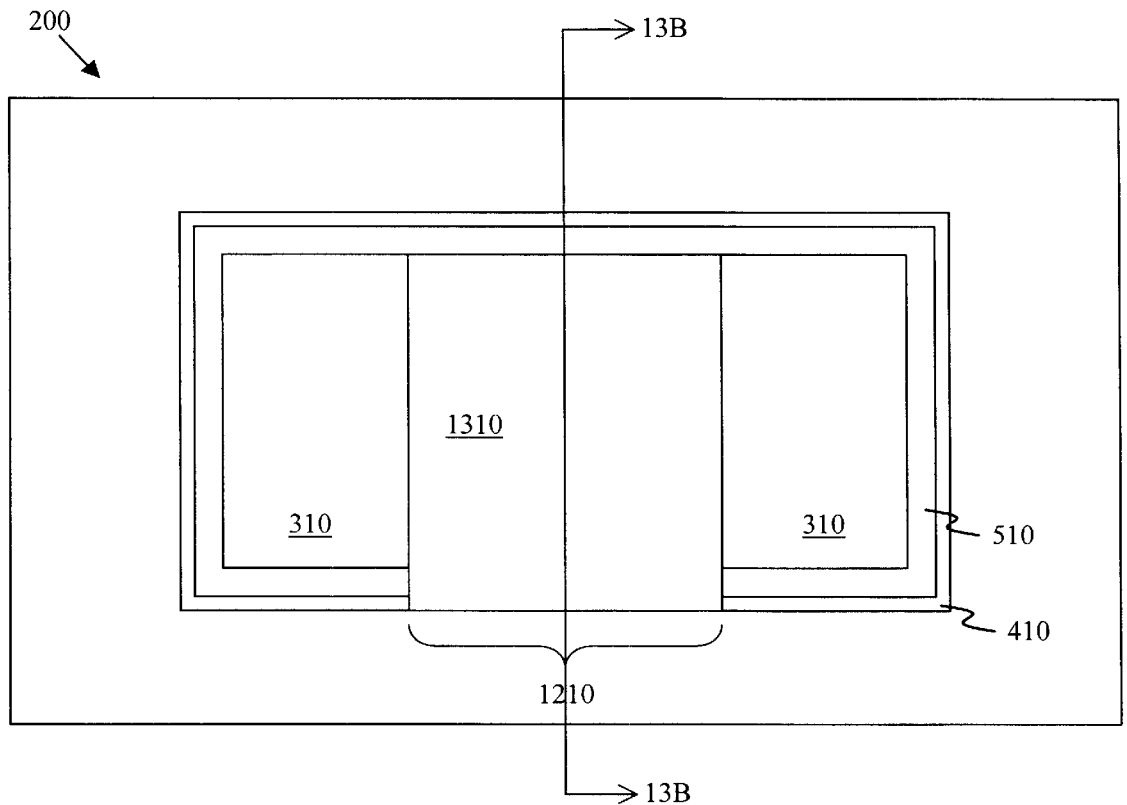
FIGS. 13A, 13B, 13C and 13D illustrate various views of the partially completed transistor device, illustrated in FIGS. 12A and 12B, after formation of a gate oxide layer.
Figure 13B:
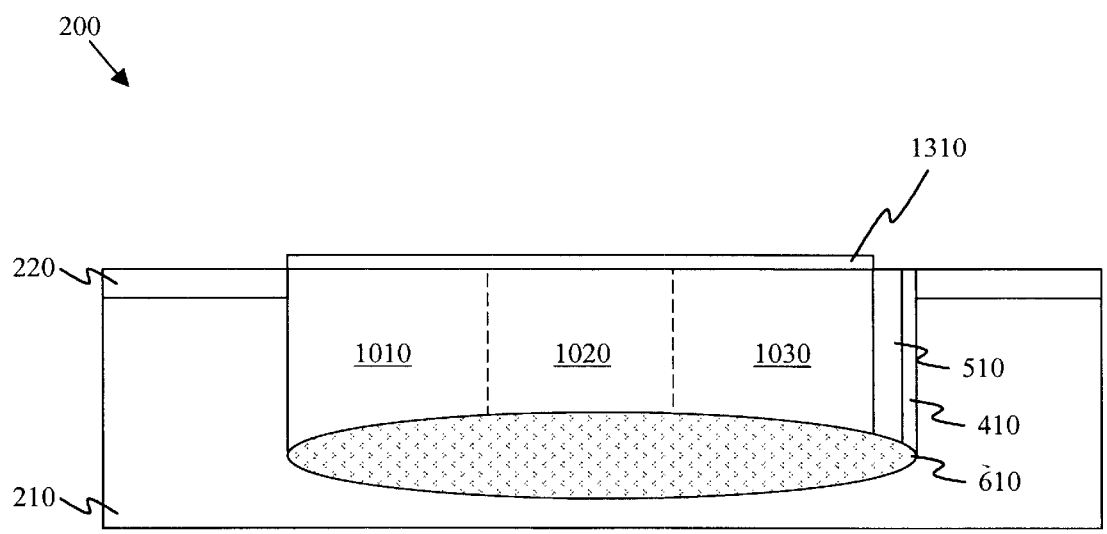
Figure 13C:
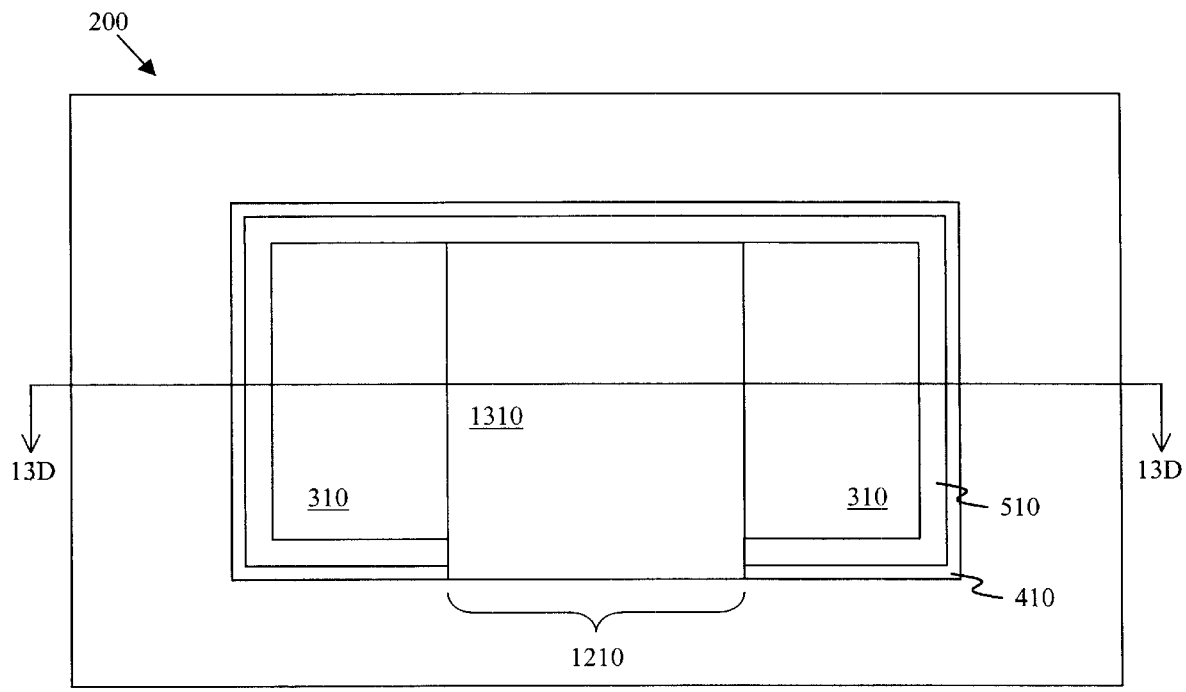
Figure 13D:
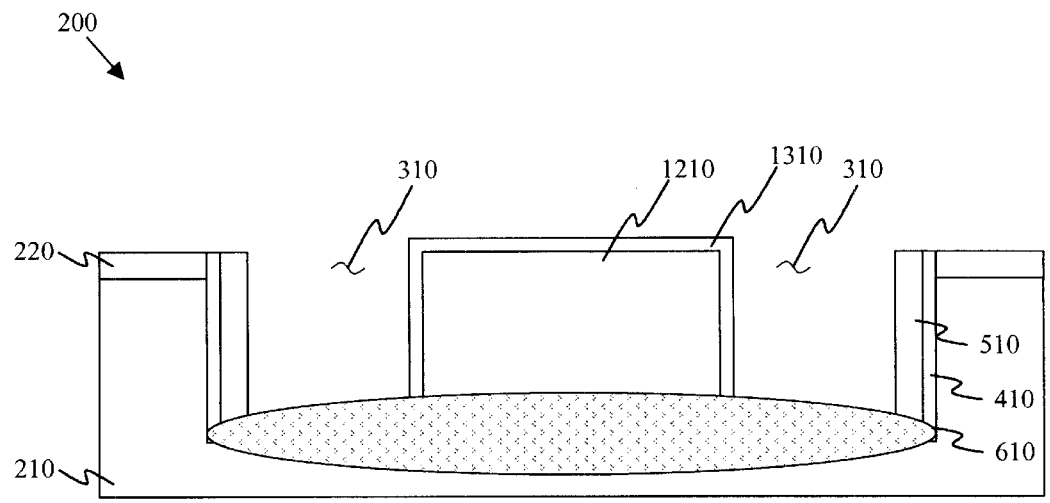
Figure 14A:
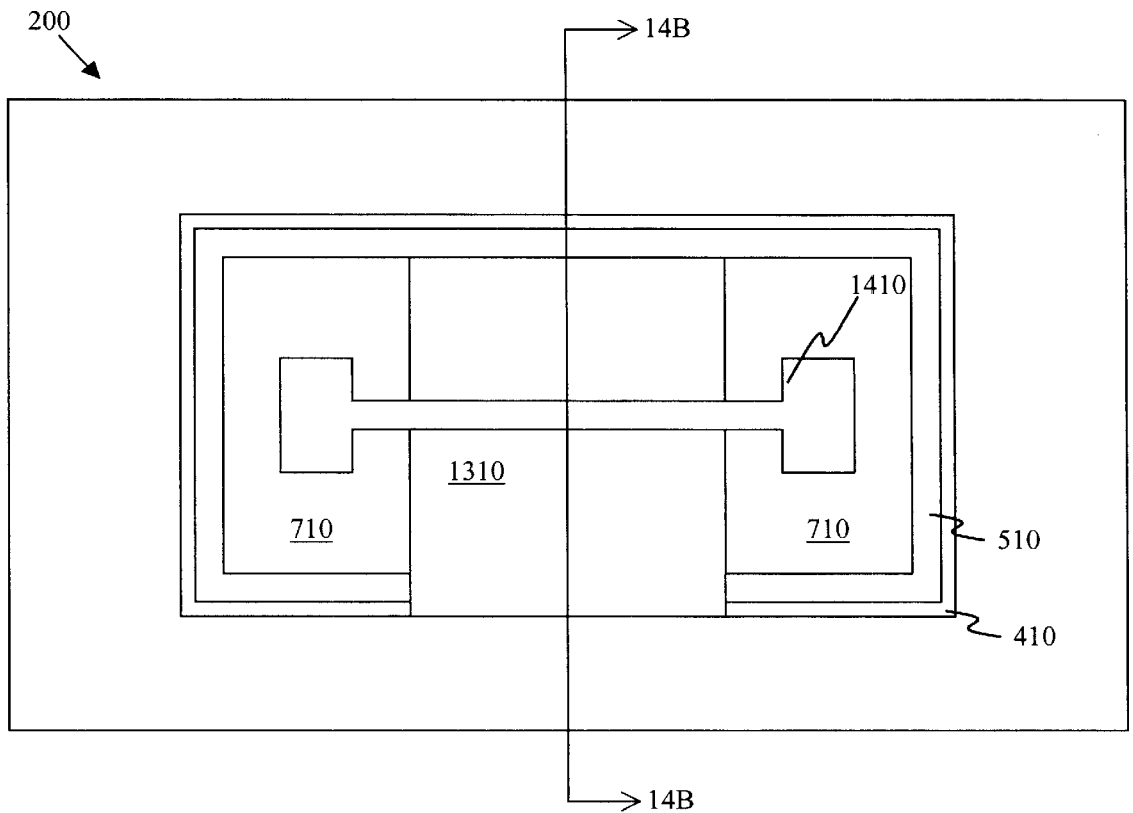
FIGS. 14A, 14B, 14C and 14D illustrate the partially completed transistor device illustrated in FIGS. 13A, 13B, 13C and 13D, after formation of a transistor gate.
Figure 14B:
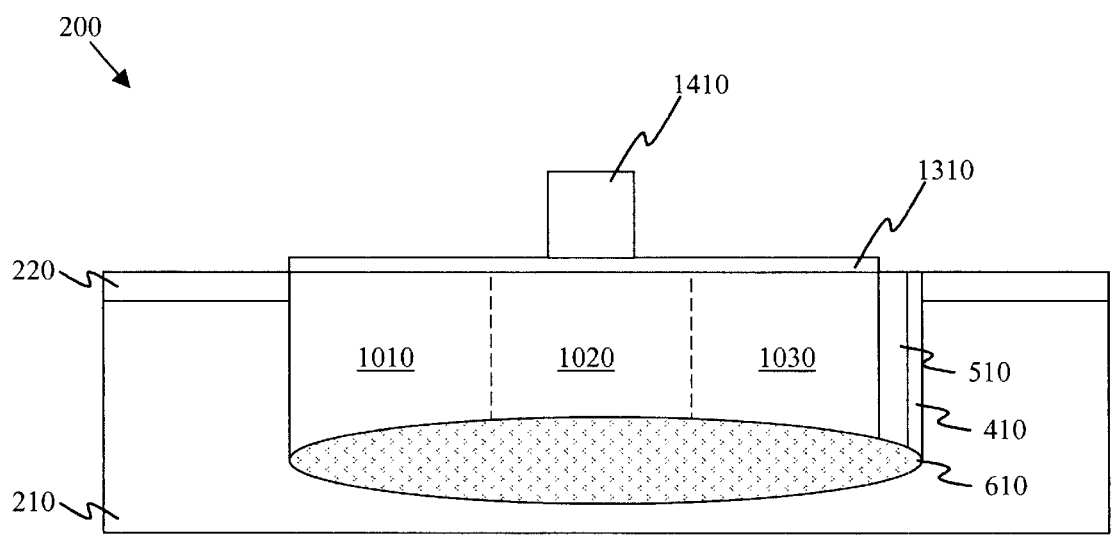
Figure 14C:
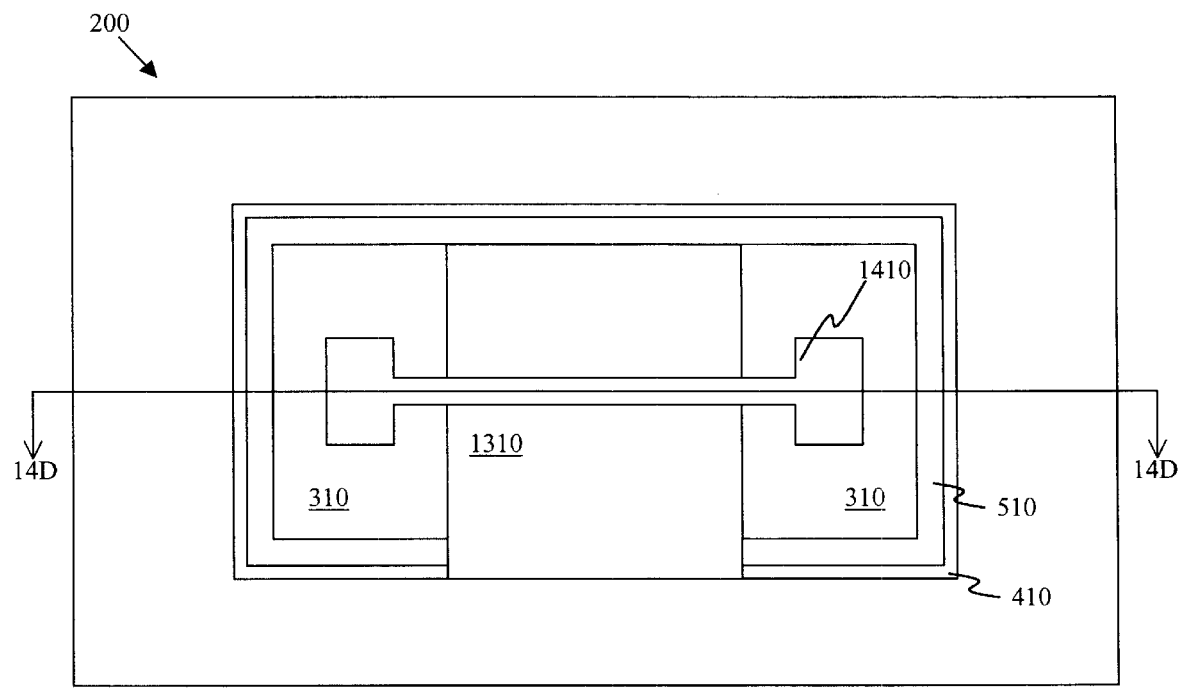
Figure 14D:
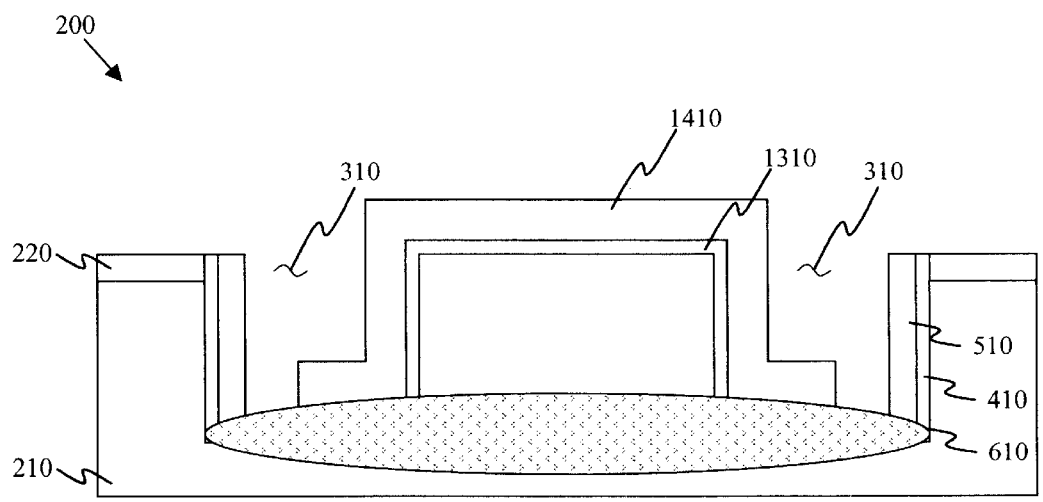
Figure 15A:
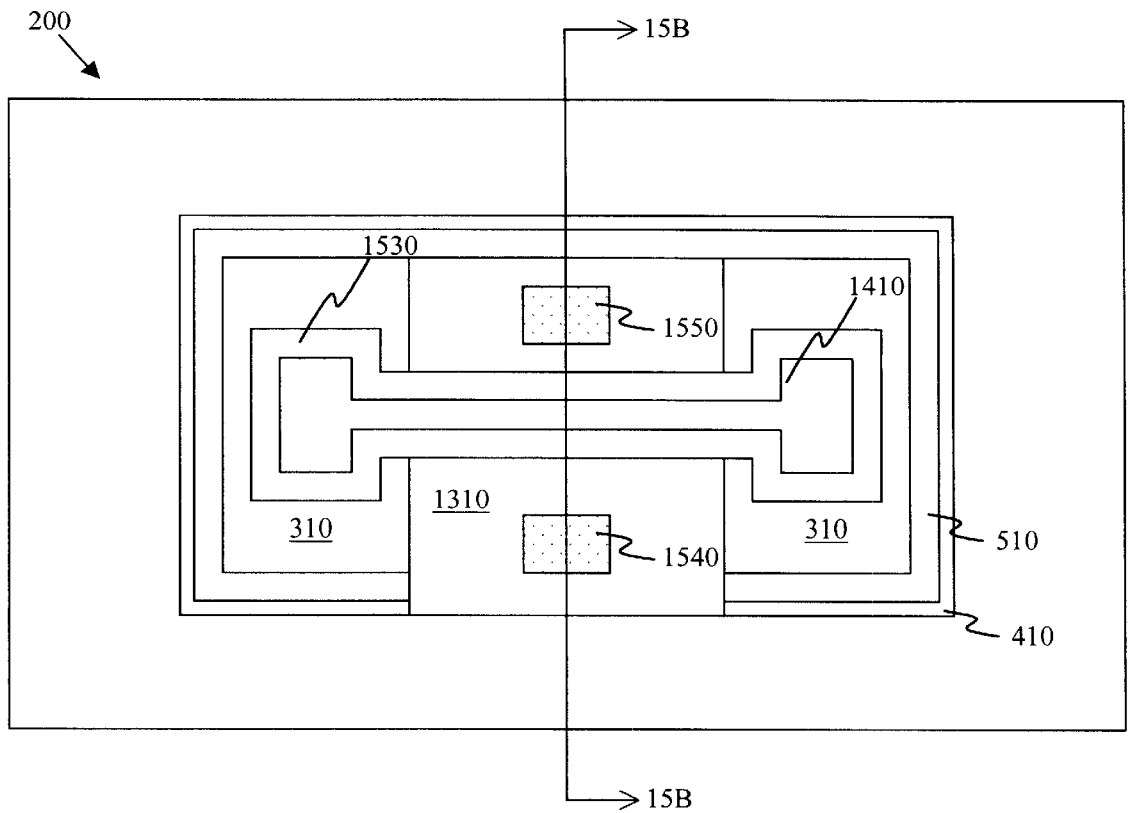
FIGS. 15A, 15B, 15C and 15D illustrate the partially completed transistor device illustrated in FIGS. 14A, 14B, 14C and 14D after a lightly doped source and lightly doped drain implant.
Figure 15B:
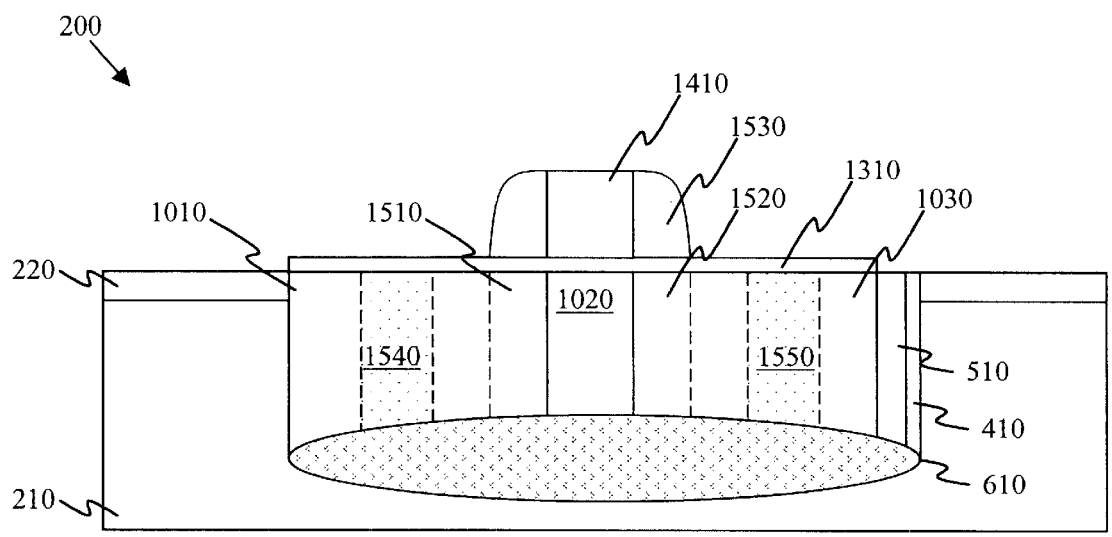
Figure 15C:
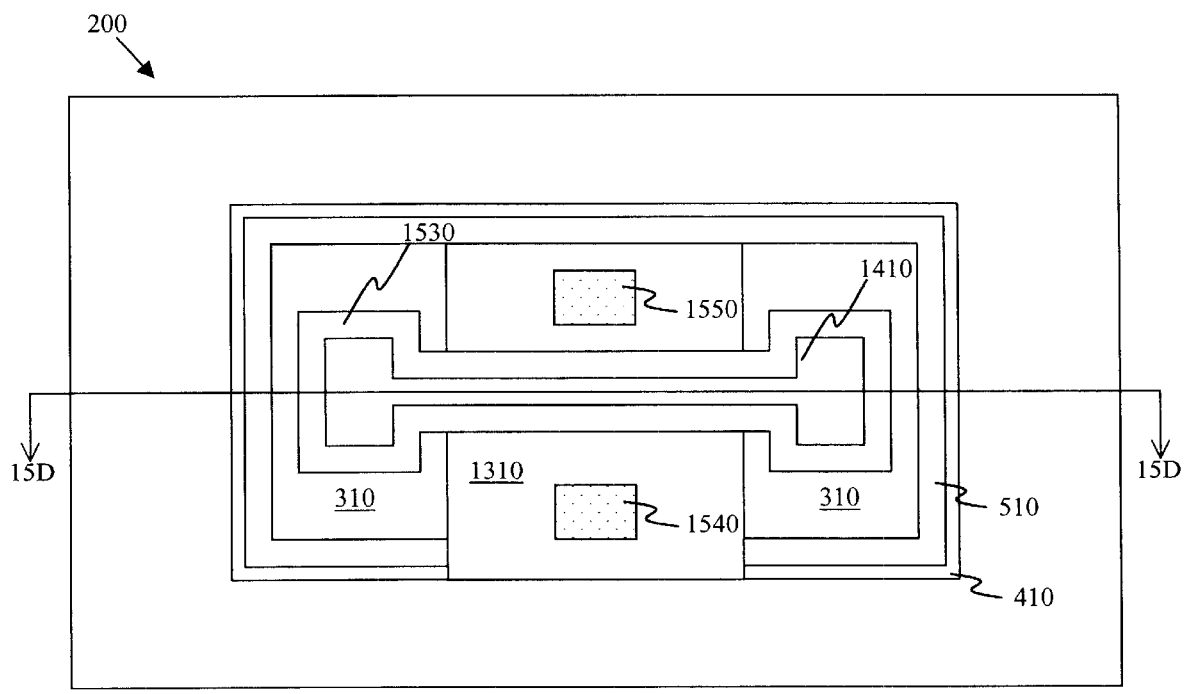
Figure 15D:
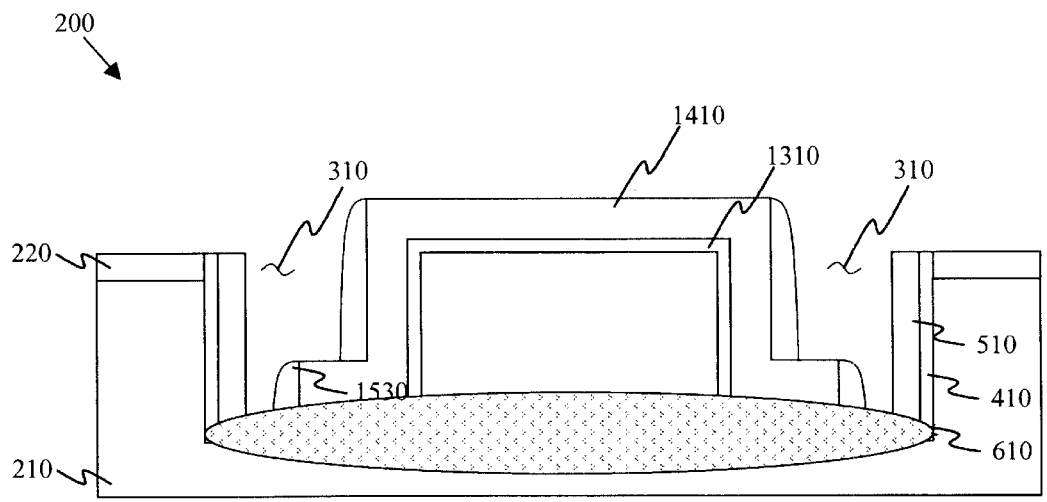

Turning to FIGS. 13A, 13B, 13C, and 13D, illustrated are various views of the partially completed transistor device 200, illustrated in FIGS. 12A and 12B, after formation of a gate oxide layer 1310. In an advantageous embodiment, the gate oxide layer 1310 is formed to a thickness of about 10 nm or less. In the illustrative embodiment, the gate oxide layer 1310 is formed over the source region 1010, channel region 1020 and drain region 1030. Likewise, as illustrated in FIG. 13D, the gate oxide layer 1310 may be located on three sides of the source region 1010, channel region 1020 and drain region 1030. In this case the three sides may refer to one horizontal surface and the two vertical surfaces, forming a channel region surrounded on three sides by a gate. It should be noted that the present invention is not limited to a gate oxide layer 1310 that is located on three sides of the source region 1010, channel region 1020 and drain region 1030, and that the gate oxide, in an alternative exemplary embodiment, could only be located on one side of the source region 1010, channel region 1020 and drain region 1030, as illustrated in FIGS. 16A–21D.

Turning to FIGS. 14A, 14B, 14C and 14D, illustrated is the partially completed transistor device 200 illustrated in FIGS. 13A, 13B, 13C and 13D, after formation of a transistor gate 1410. In the illustrated embodiment, a portion of the transistor gate 1410 is formed on the post and a portion is formed in the trench 310. Generally, one having skill in the art knows how to form such a transistor gate 1410, including: blanket depositing a gate poly material, doping the blanket deposited gate poly material, and patterning and etching the blanket deposited gate poly material, resulting in the transistor gate 1410 shown. In the illustrative embodiment shown in FIGS. 14A, 14B, 14C and 14D, the transistor gate 1410 is located over the gate oxide layer 1310 and over three sides of the channel region 1020.

Turning to FIGS. 15A, 15B, 15C and 15D, illustrated is the partially completed transistor device 200 illustrated in FIGS. 14A, 14B, 14C and 14D after a lightly doped source 1510 and lightly doped drain 1520 region. As illustrated, the lightly doped drain and lightly doped source regions 1510, 1520, may be located in the channel region 1020, and in an exemplary embodiment are self-aligned to the transistor gate 1410. One having skill in the art knows the standard methods used to form the lightly doped source and drain regions 1510, 1520. Likewise, the lightly doped source and drain regions 1510, 1520, should be doped with a similar dopant as the source and drain regions 1010, 1030. Thus, when the source and drain regions 1010, 1030, are doped with an n-type dopant, the lightly doped source and drain regions 1510, 1520, should be doped with an n-type dopant, and vice-versa.

After formation of the lightly doped source and drain regions 1510, 1520, the partially completed transistor device 200 may be subjected to a conformal deposition of a sidewall spacer layer. In an exemplary embodiment, the sidewall spacer layer is an oxide sidewall spacer layer. After formation of the sidewall spacer layer, the sidewall spacer layer may be etched, typically using a traditional anisotropic etch, resulting in gate sidewall spacers 1530 illustrated in FIGS. 15A, 15B, 15C and 15D.

In an optional embodiment, the source and drain regions 1010, 1030, may be subjected to a contact implant, resulting in a source contact implant 1540 and a drain contact implant 1550. The source and drain contact implants 1540, 1550, may be desired because, theoretically, they improve the contact resistance for vertical contacts, not shown. Following the formation of the optional source and drain contact implants 1540, 1550, the partially completed transistor device 200 may be subjected to conventional contact and metallization processes, resulting in the completed transistor device 100, illustrated in FIGS. 1A, 1B, 1C and 1D.

Figure 16A:
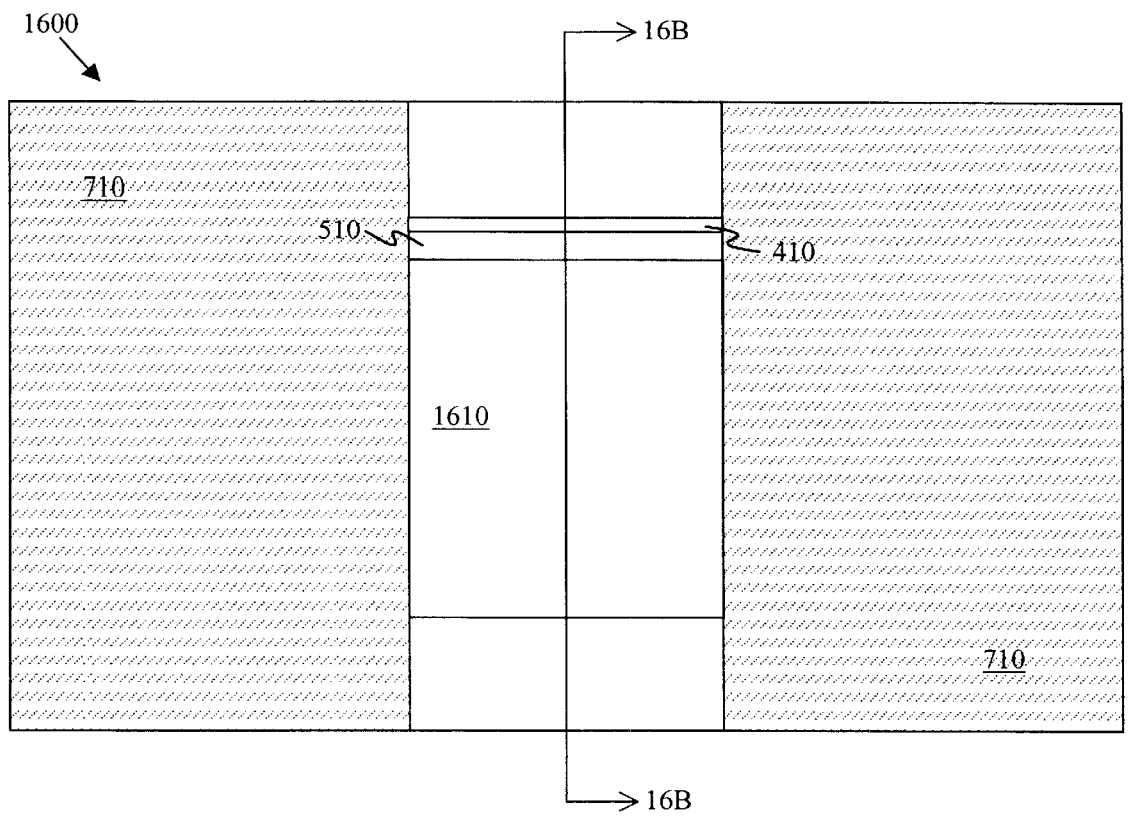
FIGS. 16A and 16B illustrate an alternative embodiment partially completed transistor device, somewhat similar to the partially completed transistor device illustrated in FIGS. 10A and 10B.

Turning to FIGS. 16A–21D, illustrated are detailed manufacturing steps instructing how one might manufacture an alternative embodiment of the completed transistor device 100 depicted in FIGS. 1A, 1B, 1C and 1D. Illustrated in FIGS. 16A and 16B, is an alternative embodiment partially completed transistor device 1600, somewhat similar to the partially completed transistor device 200, illustrated in FIGS. 10B and 10B. Moreover, the steps used to manufacture the alternative embodiment partially completed transistor device 1600, illustrated in FIGS. 16A and 16B, are similar to the manufacturing steps depicted in FIGS. 2A–9B. One of the only differences between the alternative embodiment partially completed transistor device 1600 and the partially completed transistor device 200, illustrated in FIGS. 10A and 10B, is that the epitaxial silicon, grown from the exposed wall of the trench 920, does not include the heavily doped source and drain regions 1010, 1030 (FIG. 10). In contrast, the alternative embodiment partially completed transistor device 1600 depicted in FIGS. 16A and 16B, contains one lightly doped channel region 1610. In an exemplary embodiment, the lightly doped channel region 1610 is doped with a p-type dopant to a concentration ranging from about 1E16/cm$^3$ to about 1E17/cm$^3$.

Figure 16B:
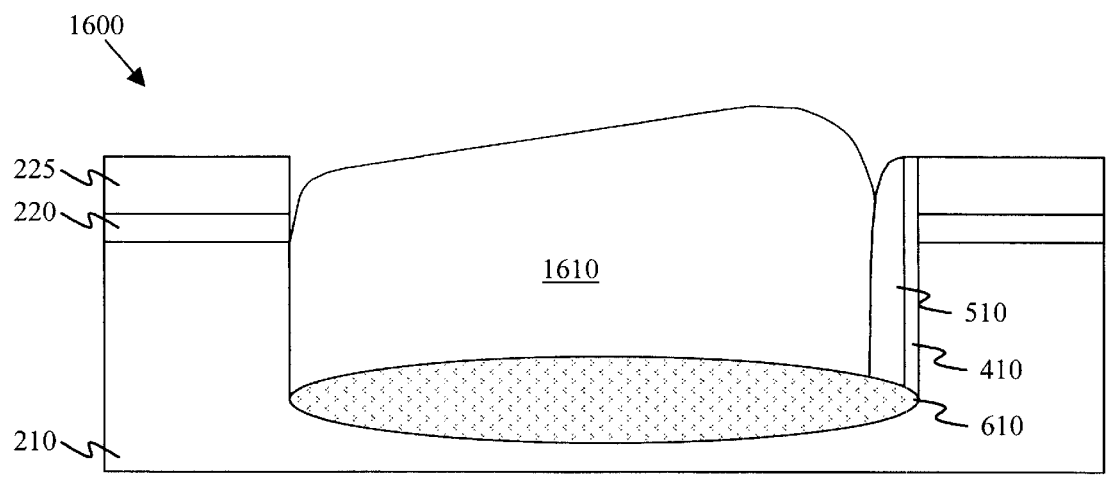
Figure 17A:
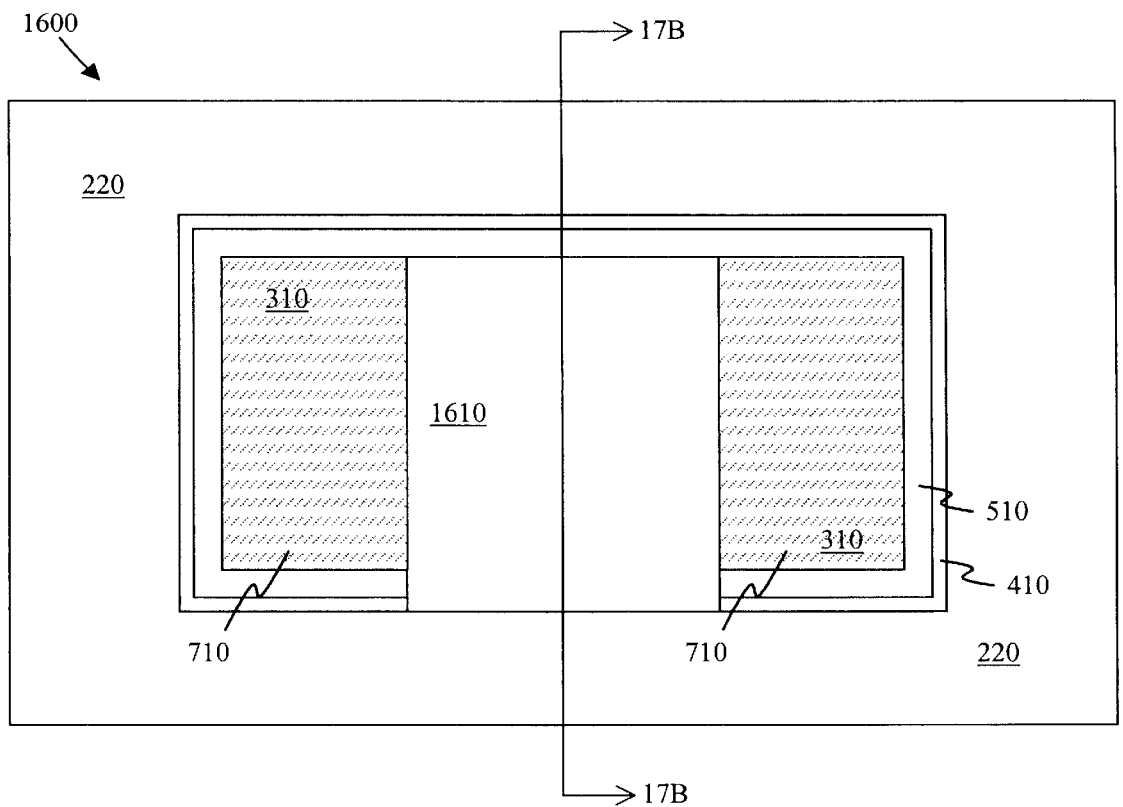
FIGS. 17A and 17B illustrate the alternative embodiment partially completed transistor device, illustrated in FIGS. 16A and 16B, after a conventional chemical mechanical planarization (CMP) process.
Figure 17B:
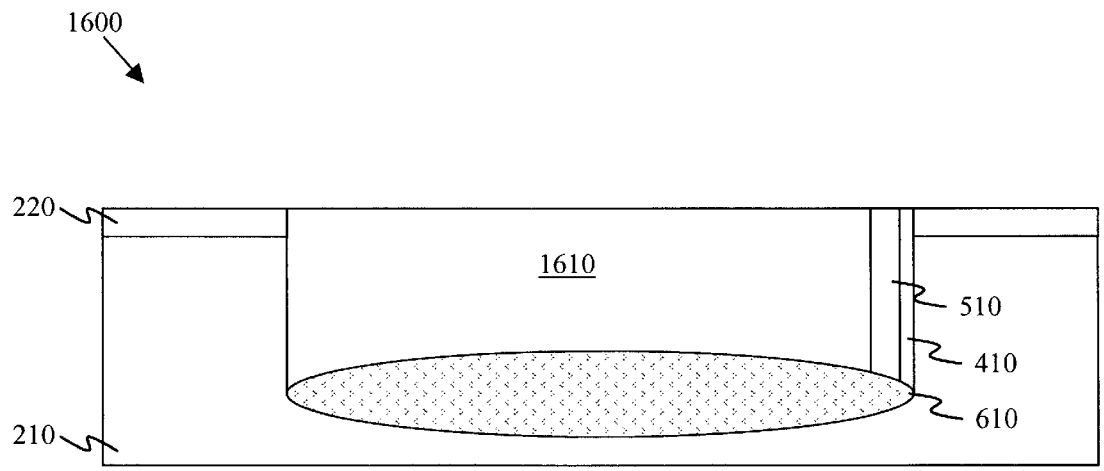
Figure 18A:
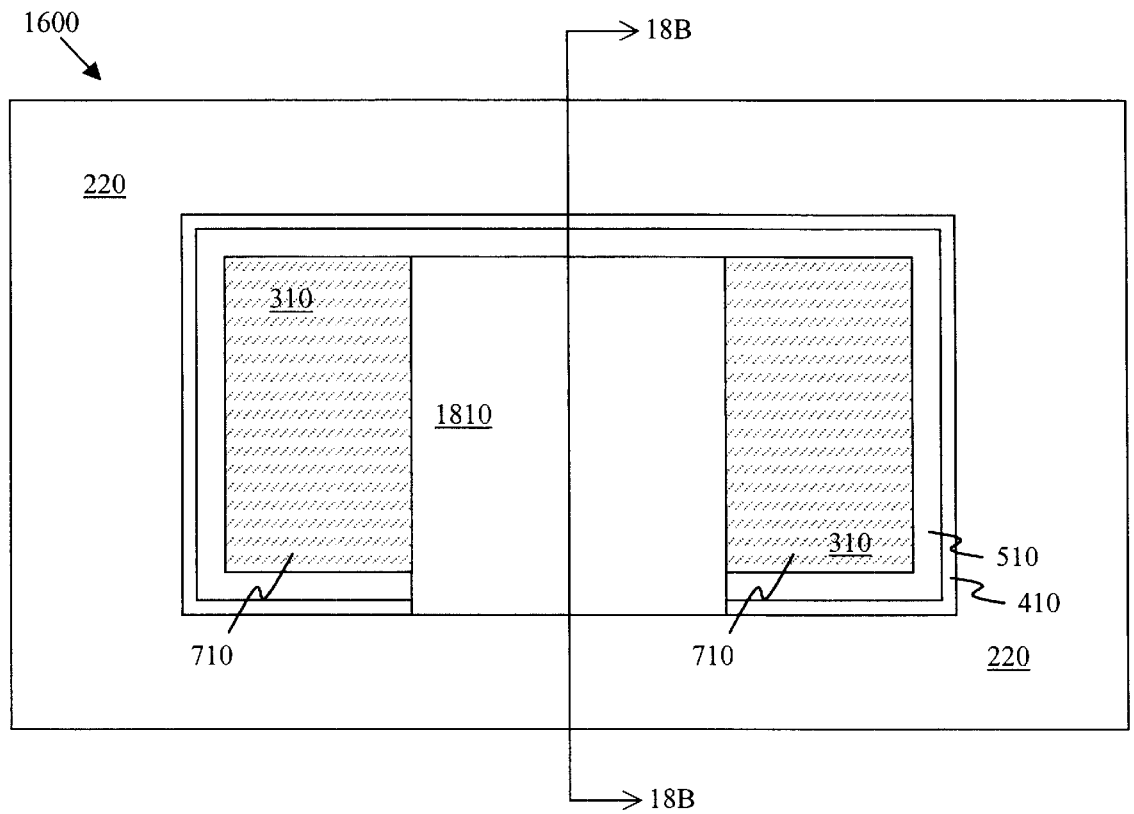
FIGS. 18A, 18B, 18C and 18D illustrate various views of the alternative embodiment partially completed transistor device illustrated in FIGS. 17A and 17B, after formation of a gate oxide layer.
Figure 18B:
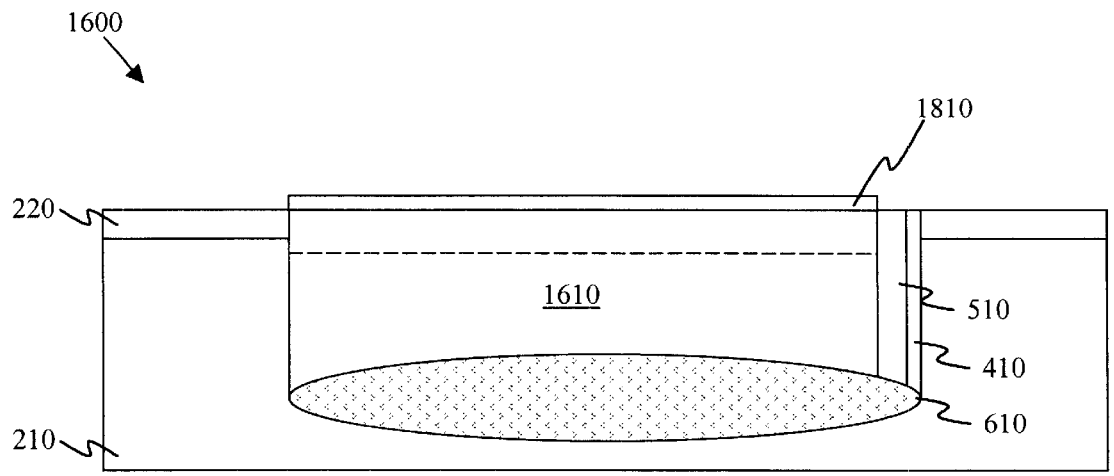
Figure 18C:
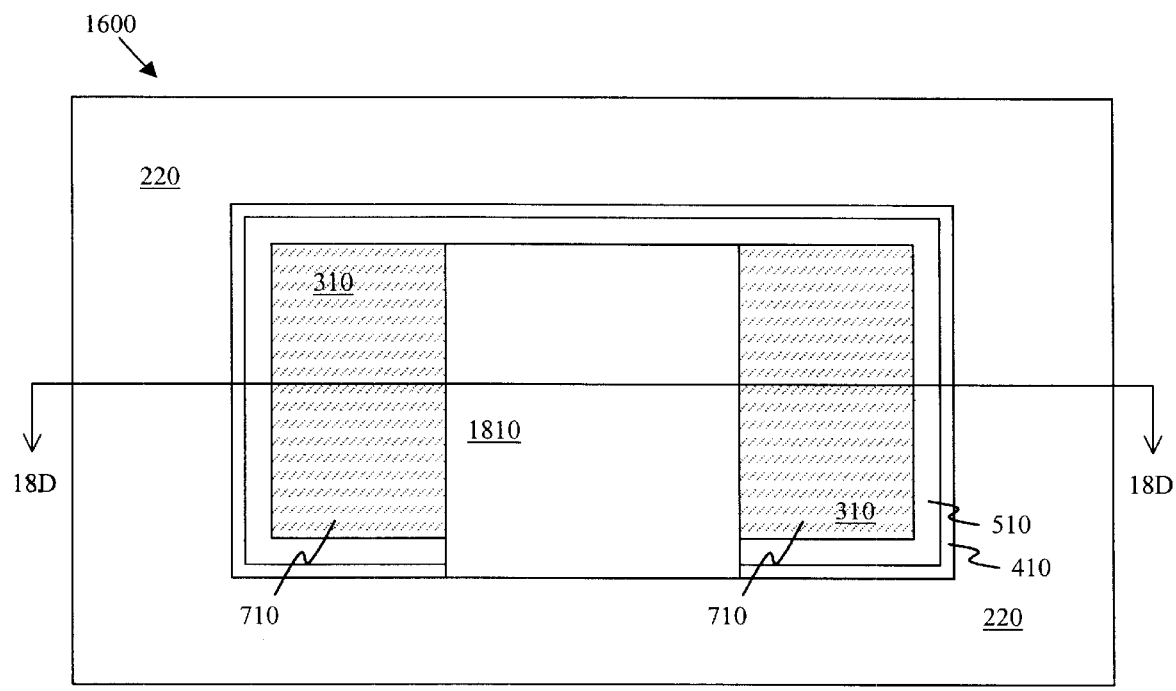
Figure 18D:
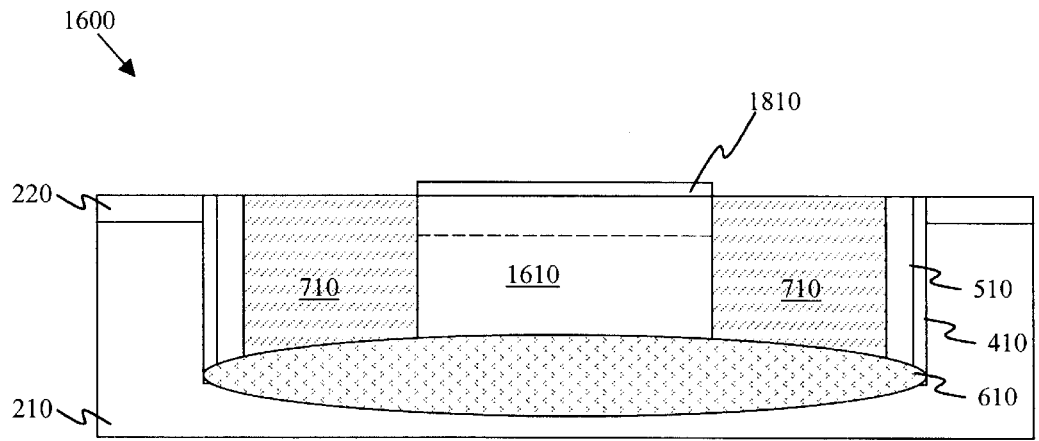
Figure 19A:
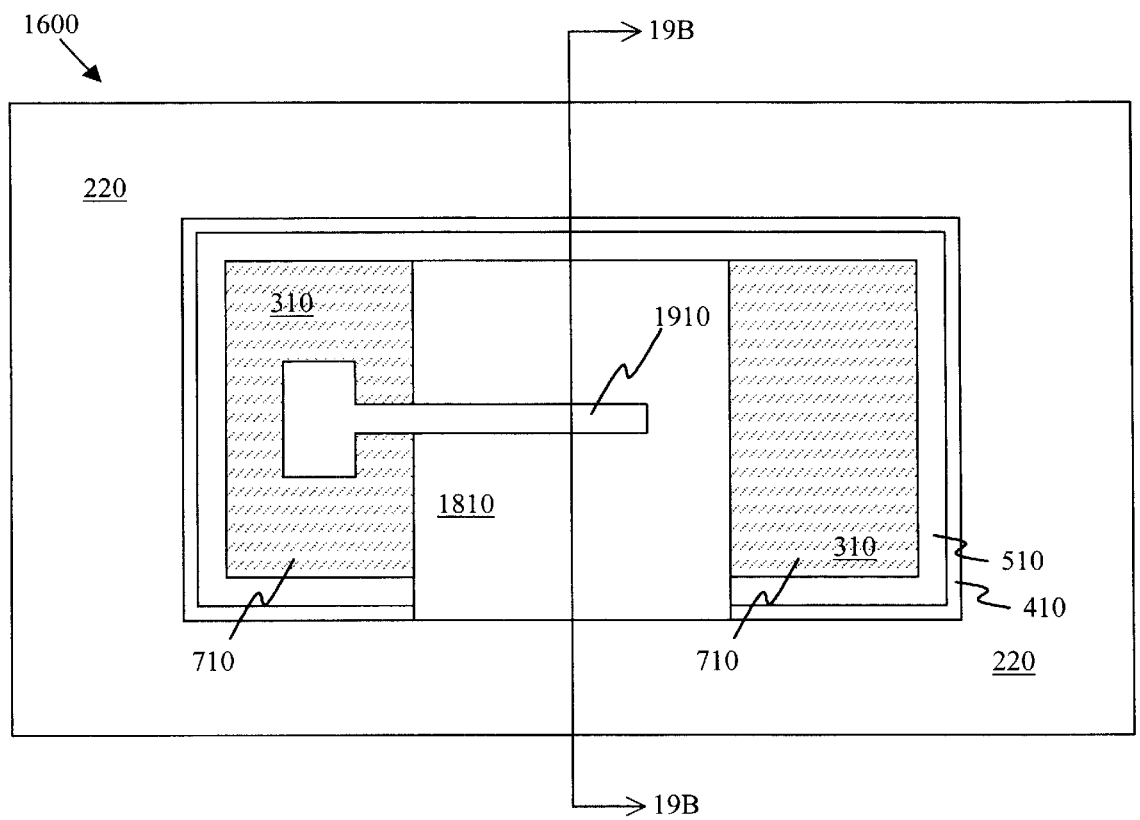
FIGS. 19A, 19B, 19C and 19D illustrate the alternative embodiment partially completed transistor device illustrated in FIGS. 18A, 18B, 18C and 18D, after formation of a transistor gate.
Figure 19B:
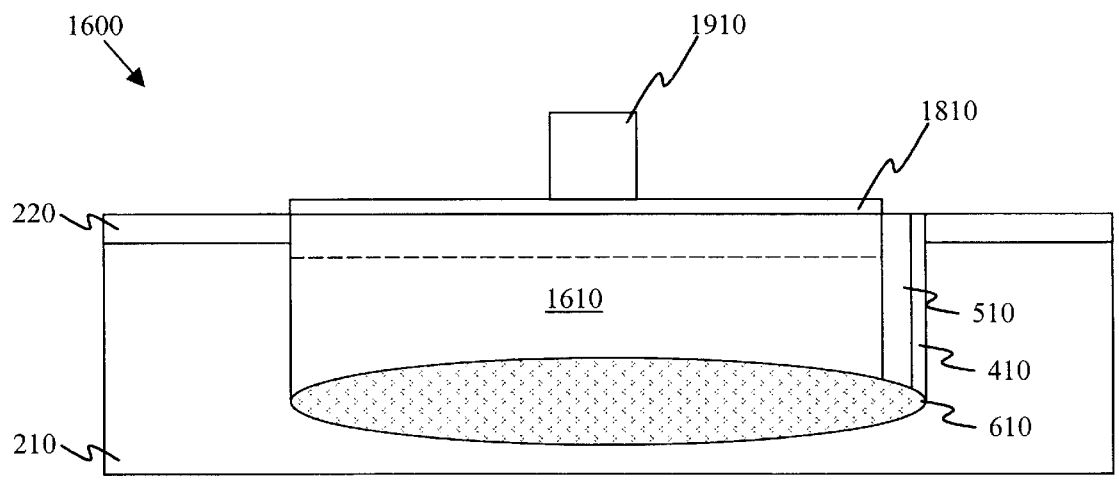
Figure 19C:
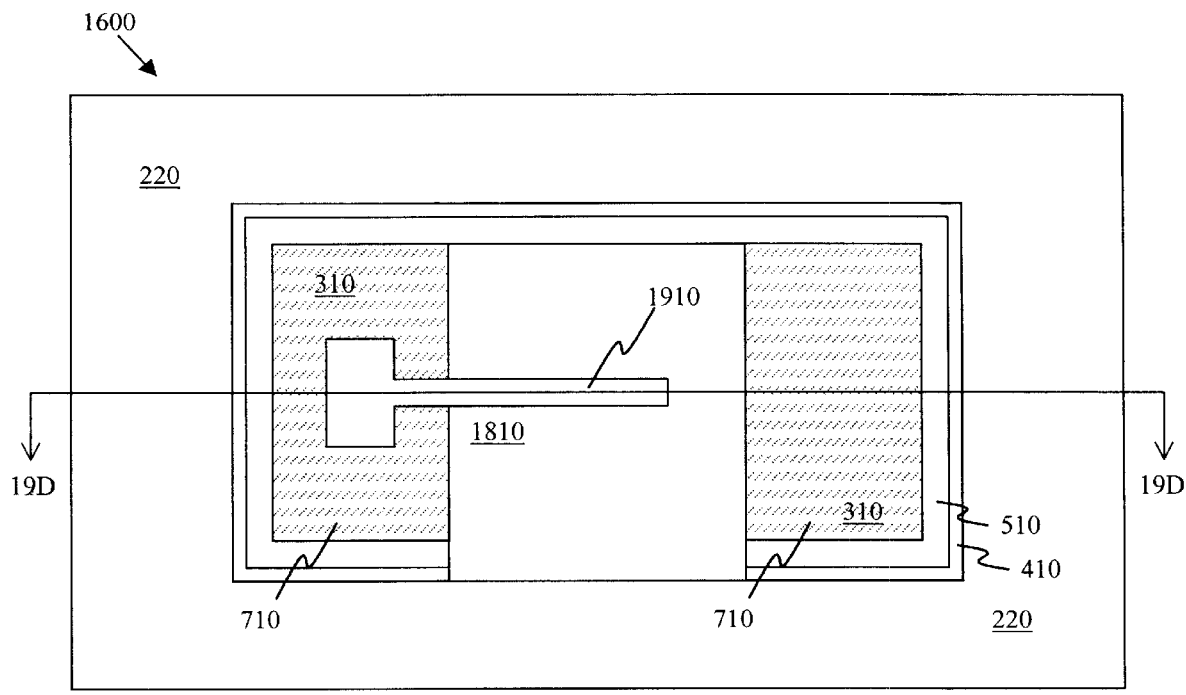
Figure 19D:
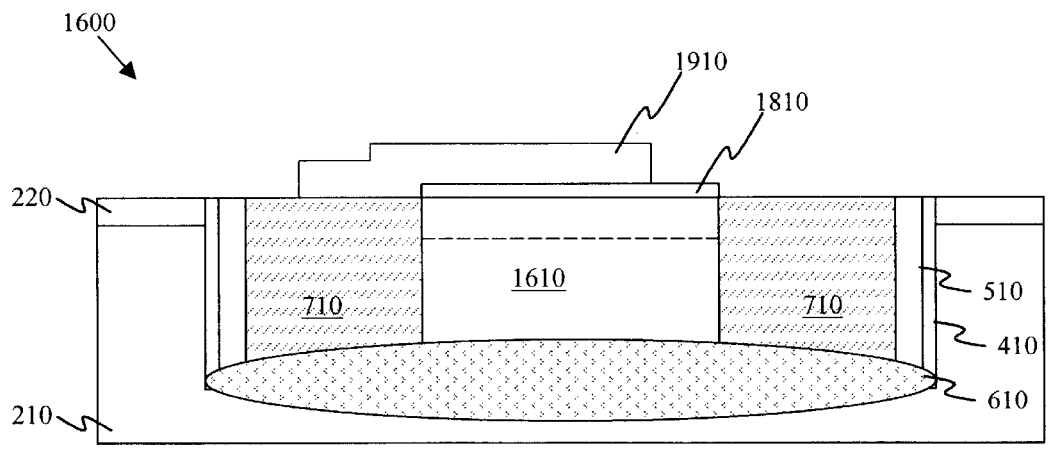
Figure 20A:
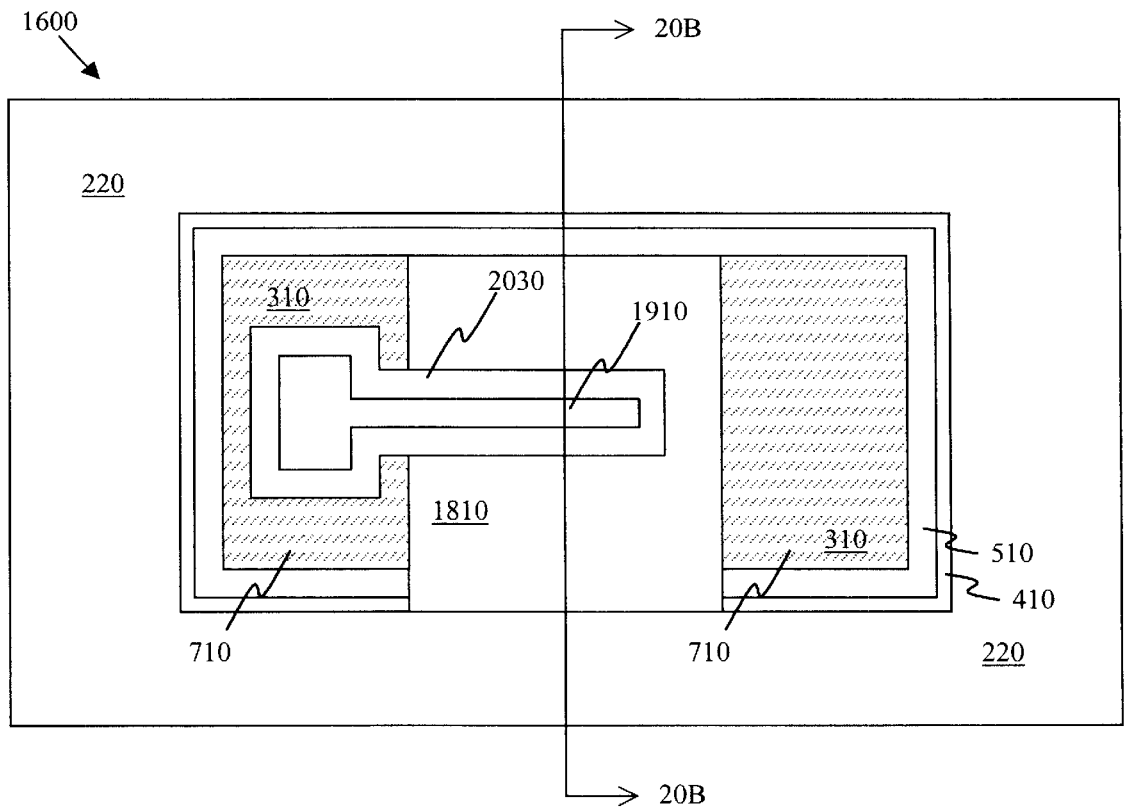
FIGS. 20A, 20B, 20C and 20D illustrate the partially completed transistor device illustrated in FIGS. 19A, 19B, 19C and 19D after a lightly doped source and lightly doped drain implant.
Figure 20B:
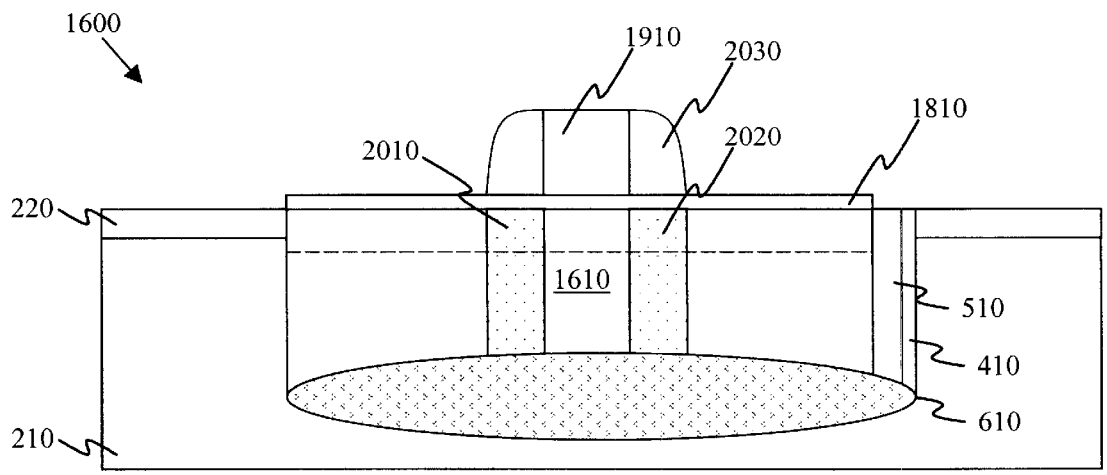
Figure 20C:
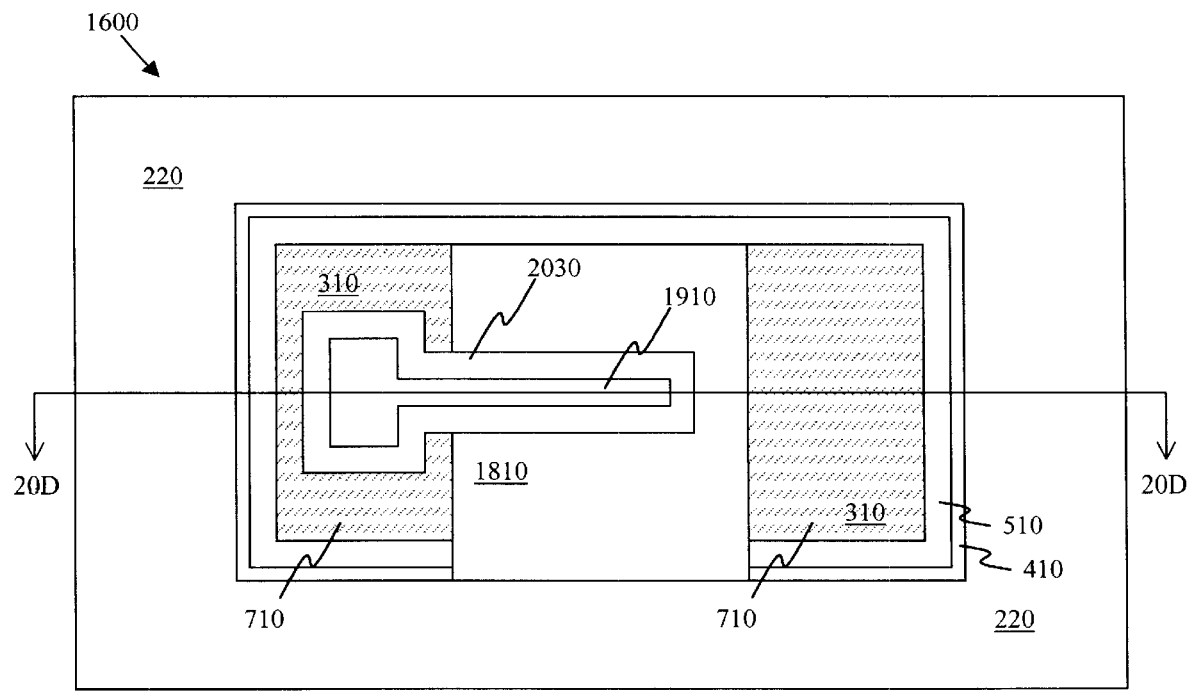
Figure 20D:
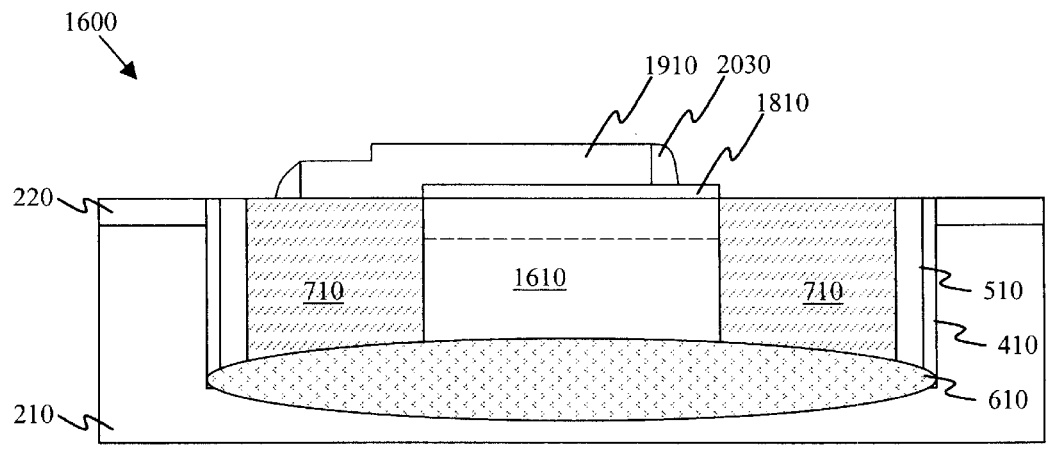
Figure 21A:
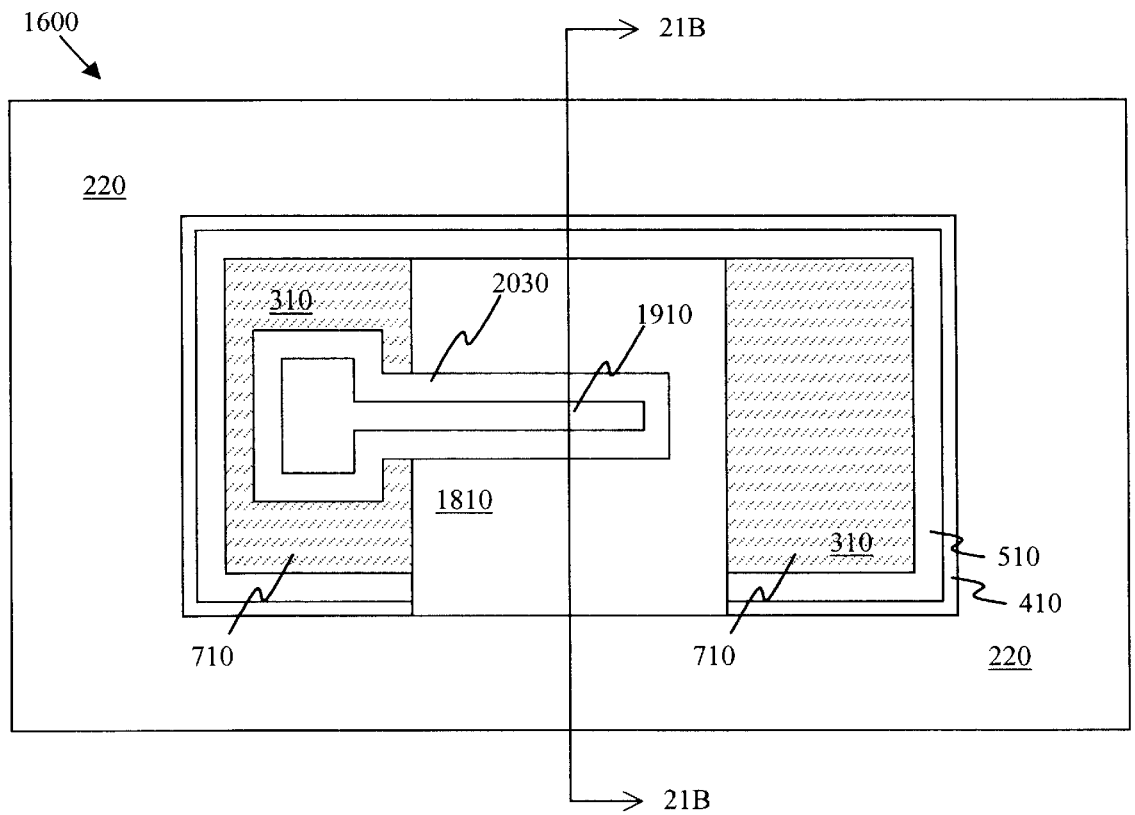
FIGS. 21A, 21B, 21C and 21D illustrate the formation of a heavily doped source region and a heavily doped drain region.
Figure 21B:
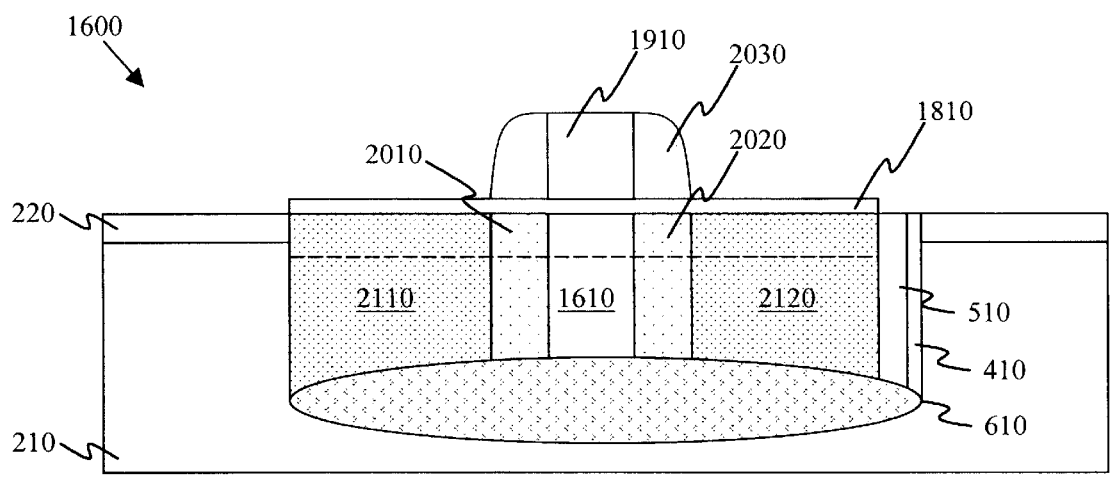
Figure 21C:
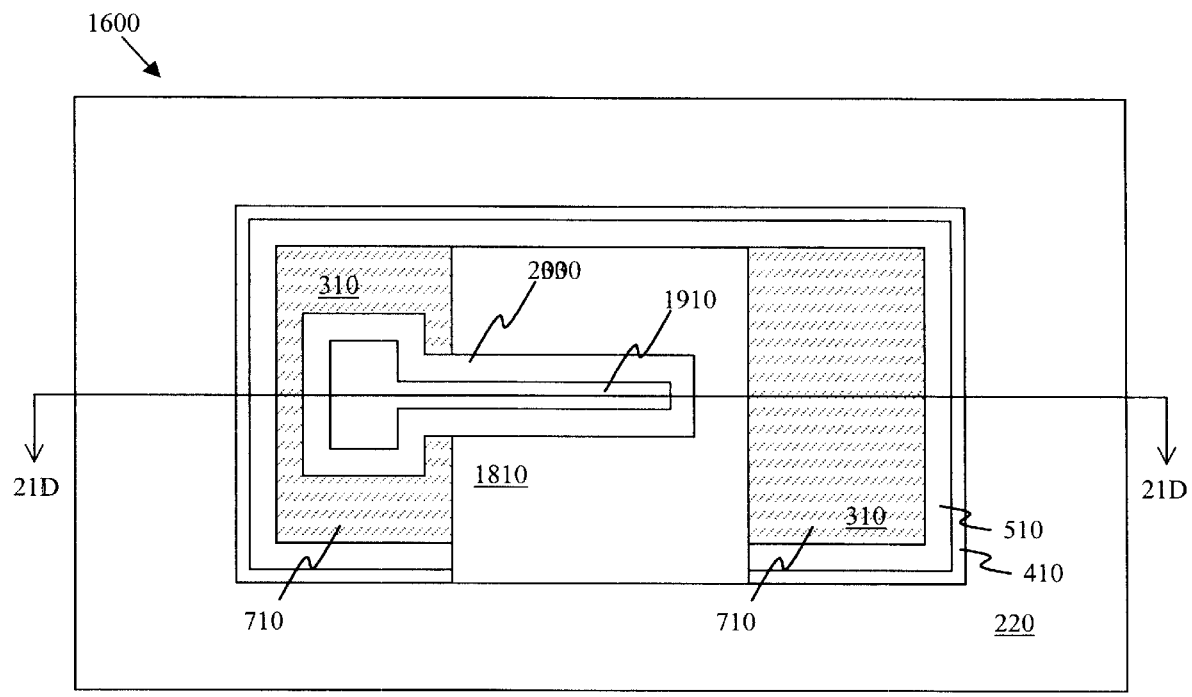
Figure 21D:
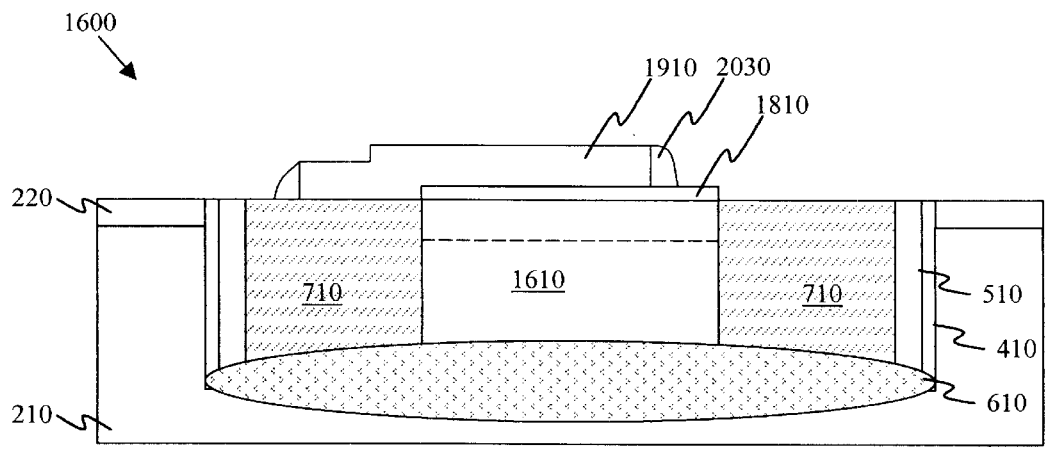

Turning to FIGS. 17A and 17B, illustrated is the alternative embodiment partially completed transistor device 1600, illustrated in FIGS. 16A and 16B, after a conventional chemical mechanical planarization (CMP) process. In the illustrative embodiment, the CMP process removes the excess dielectric layer 710, the sacrificial oxide layer 225 and vertically over-grown epitaxial regions of the channel region 1610. As illustrated in FIG. 17A, the dielectric layer 710 remains in the trench 310, but is removed from areas above the etch stop layer 220. In contrast to the embodiment depicted in FIGS. 12A and 12B, the present embodiment has the dielectric layer 710 remaining in the trench 310.

Turning to FIGS. 18A, 18B, 18C, and 18D, illustrated are various views of the alternative embodiment partially completed transistor device 1600, illustrated in FIGS. 17A and 17B, after formation of a gate oxide layer 1810. In an advantageous embodiment, the gate oxide layer 1810 is formed to a thickness of about 10 nm or less. In the illustrative embodiment, the gate oxide layer 1310 is formed over the channel region 1610. In contrast to the gate oxide layer 1310 illustrated in FIG. 13D, the gate oxide layer 1810 is only located on one side (the top surface) of the channel region 1610. In an exemplary embodiment, not illustrated, the channel region 1610 may be subjected to a wet pre-gate oxidation and a wet pre-gate oxidation etch, prior to formation of the gate oxide layer 1810. Likewise, a threshold adjustment implant could, in an exemplary embodiment, be conducted prior to formation of the gate oxide layer 1810.

Turning to FIGS. 19A, 19B, 19C and 19D, illustrated is the alternative embodiment partially completed transistor device 1600 illustrated in FIGS. 18A, 18B, 18C and 18D, after formation of a transistor gate 1910. In the illustrative embodiment, the transistor gate 1910 is formed at least partially over the dielectric layer 710. Generally, one having skill in the art knows how to form such a transistor gate 1910, including: blanket depositing a gate poly material, doping the blanket deposited gate poly material, and patterning and etching the blanket deposited gate poly material, resulting in the transistor gate 1910 shown. In the illustrative embodiment shown in FIGS. 18A, 18B, 18C and 18D, the transistor gate 1910 is located over the gate oxide layer 1810 and channel region 1610.

Turning to FIGS. 20A, 20B, 20C and 20D, illustrated is the partially completed transistor device 1600 illustrated in FIGS. 19A, 19B, 19C and 19D after a lightly doped source 2010 and lightly doped drain 2020 implant. As illustrated, the light doped source and lightly doped drain implants 2010, 2020, are located in the channel region 1610, and in an exemplary embodiment are self-aligned to the transistor gate 1910. One having skill in the art knows the standard methods used to form lightly doped source and drain regions 2010, 2020. Likewise, the lightly doped source and drain regions 2010, 2020, should be doped with an opposite dopant as used when forming the channel region 1610. Thus, when the channel region 1610 is doped with a p-type dopant, the lightly doped source and drain regions 2010, 2020, should be doped with an n-type dopant, and vice-versa.

After formation of the lightly doped source and drain regions 2010, 2020, the alternative embodiment partially completed transistor device 1600 may be subjected to a conformal deposition of a sidewall spacer layer. In an exemplary embodiment, the sidewall spacer layer is an oxide sidewall spacer layer. After formation of the sidewall spacer layer, the sidewall spacer layer may be etched, typically using a traditional anisotropic etch, resulting in gate sidewall spacers 2030 illustrated in FIGS. 20A, 20B, 20C and 20D.

Turning to FIGS. 21A, 21B, 21C and 21D, illustrated is the formation of a heavily doped source region 2110 and a heavily doped drain region 2120. One having skill in the art knows how to form the heavily doped source and drain regions 2110, 2120, including patterning a layer of photoresist to leave unprotected portions where the heavily doped source and drain regions 2110, 2120, are desired, and doping the unprotected portions with an n-type dopant. In the illustrative embodiment, it is desired for the heavily doped source and drain regions 2110, 2120, to have a concentration of the n-type dopant ranging from about $1E19/cm^3$ to about $1E20/cm^3$. Following the formation of the heavily doped source and drain regions 2110, 2120, the alternative embodiment partially completed transistor device 1600 could be subjected to conventional contact and metallization processes, resulting in a completed alternative embodiment transistor device.

Figure 22:
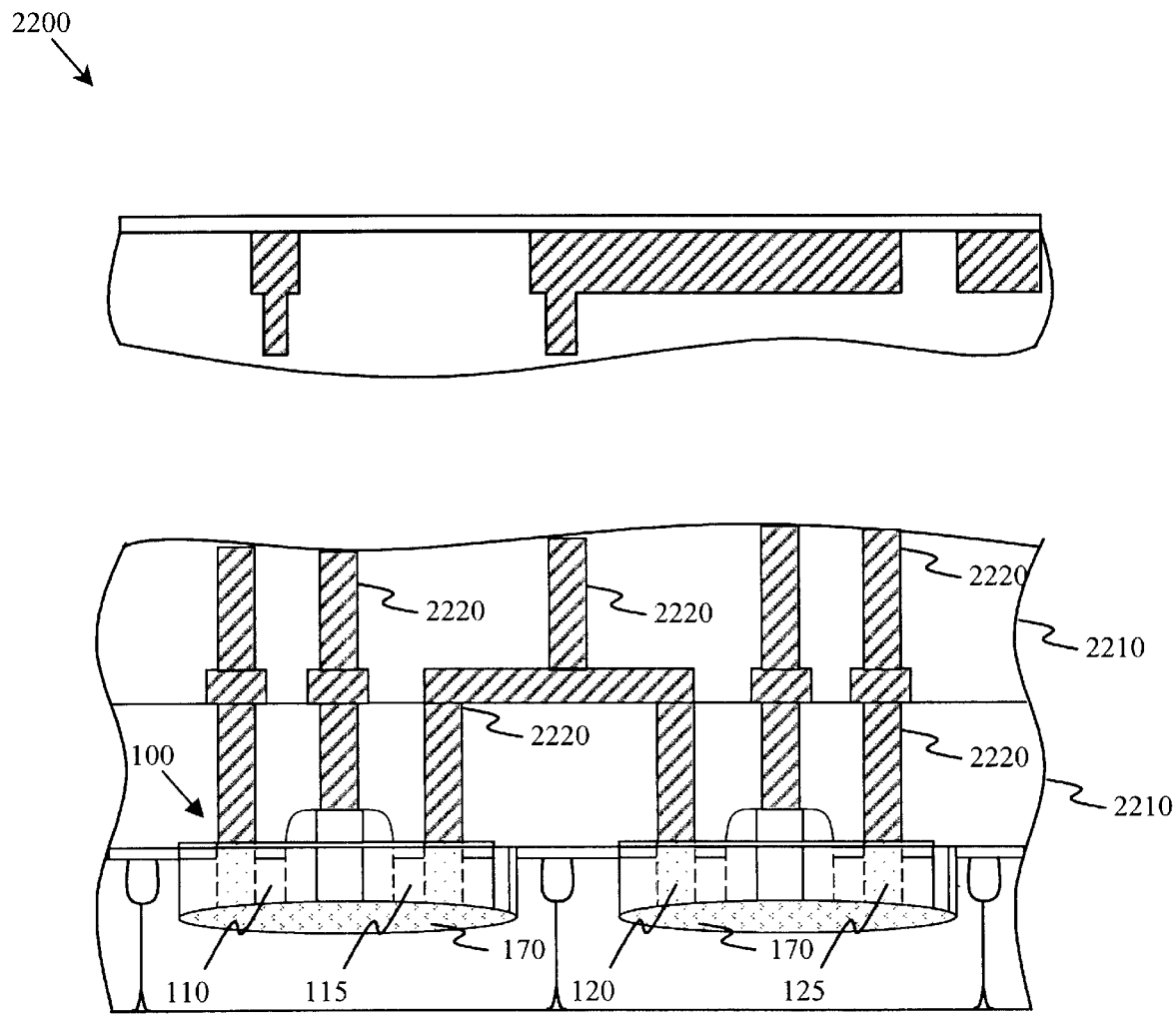
FIG. 22 illustrates a completed integrated circuit, which forms one environment where the completed transistor device could be used.

Turning to FIG. 22, illustrated is a completed integrated circuit 2200, which represents one environment in which the completed transistor 100 could be used. The integrated circuit 2500 may include the completed transistor device 100, illustrated in FIGS. 1A, 1B, 1C and 1D, including: the source region 110, drain region 115, source region contact 120, drain region contact 125, transistor gate 130, and dielectric region 170. The transistor device 100 may for part of a complementary metal oxide semiconductor (CMOS) device, bipolar CMOS (BiCMOS) device or any other type of similar device. Also shown in one advantageous embodiment of the integrated circuit 2200 are dielectric layers 2210. Moreover, interconnect structures 2220, may be located within the dielectric layer 2210, to contact the source region 110, drain region 115 and transistor gate 130, to form the operational integrated circuit 2200.

Although the present invention has been described in detail, those skilled in the art should understand that they can make various changes, substitutions and alterations herein without departing from the spirit and scope of the invention in its broadest form.

What is claimed is:

1. A transistor device, comprising:
   a dielectric region located in a trench in a semiconductor substrate, wherein said dielectric region and said trench do not form a portion of a shallow trench isolation (STI) structure;
   a source region and a drain region located in the trench and at least partially on the dielectric region; and
   a channel region located in the trench between the source region and drain region and at least partially on the dielectric region.

2. The transistor device as recited in claim 1 wherein the source region, drain region and channel region comprise epitaxial silicon.

3. The transistor device as recited in claim 1 wherein a side wall of the trench includes an oxide layer.

4. The transistor device as recited in claim 3 further including a nitrided layer located on the oxide layer.

5. The transistor device as recited in claim 1 further including a gate oxide located over the source region, drain region and channel region.

6. The transistor device as recited in claim 5 further including a gate located over the gate oxide.

7. The transistor device as recited in claim 1 further including a gate oxide located on three sides of the source region, drain region and channel region.

8. The transistor device as recited in claim 7 further including a gate oxide located on the horizontal top and on the two vertical sides of the source region, drain region and channel region.

9. The transistor device as recited in claim 7 further including a gate located over the gate oxide and located over three sides of the channel region.

10. The transistor device as recited in claim 9 further including an oxide sidewall spacer contacting the gate.

11. The transistor device as recited in claim 1 further including a source contact implant and a drain contact implant.

12. The transistor device as recited in claim 1 wherein the source region, drain region and channel region form a post in the trench.

13. The transistor device as recited in claim 11 further including a gate wherein a portion of the gate is located on the post and a portion of the gate is located in the trench.

14. An integrated circuit, comprising:
   at least two transistors, each including;
   a dielectric region located in a trench in a semiconductor substrate, wherein said dielectric region and said trench do not form a portion of a shallow trench isolation (STI) structure;
   a source region and a drain region located in the trench and at least partially on the dielectric region; and
   a channel region located in the trench between the source region and drain region and at least partially on the dielectric region; and dielectric layers located over the transistors and having interconnect structures located therein that electrically connect the transistors to form an operative integrated circuit.

15. The integrated circuit as recited in claim 14 wherein the source region, drain region and channel region comprise epitaxial silicon.

16. The integrated circuit as recited in claim 14 wherein a side wall of the trench includes an oxide layer.

17. The integrated circuit as recited in claim 16 further including a nitrided layer located on the oxide layer.

18. The integrated circuit as recited in claim 14 further including a gate oxide located over the source region, drain region and channel region.

19. The integrated circuit as recited in claim 18 further including a gate located over the gate oxide.

20. The integrated circuit as recited in claim 14 further including a gate oxide located on three sides of the source region, drain region and channel region.

21. The integrated circuit as recited in claim 14 further including a gate oxide located on the horizontal top and on the two vertical sides of the source region, drain region and channel region.

22. The integrated circuit as recited in claim 21 further including a gate located over the gate oxide and located over three sides of the channel region.

23. The integrated circuit as recited in claim 22 further including an oxide sidewall spacer contacting the gate.

24. The integrated circuit as recited in claim 14 further including a source contact implant and a drain contact implant.

25. The integrated circuit as recited in claim 14 wherein the source region, drain region and channel region form a post in the trench.

26. The integrated circuit as recited in claim 25 further including a gate wherein a portion of the gate is located on the post and a portion of the gate is located in the trench.

27. The integrated circuit as recited in claim 14 wherein the transistor device forms part of an n-type metal oxide semiconductor (NMOS) device, a p-type metal oxide semiconductor (PMOS) device or a complementary metal oxide semiconductor (CMOS) device.

* * * * *